(12) United States Patent
Su et al.

(10) Patent No.: US 12,142,520 B2
(45) Date of Patent: Nov. 12, 2024

(54) MIDDLE-OF-LINE INTERCONNECT STRUCTURE HAVING AIR GAP AND METHOD OF FABRICATION THEREOF

(71) Applicant: Taiwan Semiconductor Manufacturing Company, Ltd., Hsin-Chu (TW)

(72) Inventors: Yi-Nien Su, Hsinchu (TW); Jyu-Horng Shieh, Hsin-Chu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 174 days.

(21) Appl. No.: 17/884,714

(22) Filed: Aug. 10, 2022

(65) Prior Publication Data
US 2022/0384243 A1 Dec. 1, 2022

Related U.S. Application Data

(63) Continuation of application No. 17/147,177, filed on Jan. 12, 2021, now Pat. No. 11,710,657.
(Continued)

(51) Int. Cl.
*H01L 21/768* (2006.01)
*H01L 21/3213* (2006.01)
(Continued)

(52) U.S. Cl.
CPC .... *H01L 21/7682* (2013.01); *H01L 21/32133* (2013.01); *H01L 21/32139* (2013.01);
(Continued)

(58) Field of Classification Search
CPC .......... H01L 21/7682; H01L 21/32133; H01L 21/32139; H01L 21/7685; H01L 21/76895;
(Continued)

(56) References Cited

U.S. PATENT DOCUMENTS 9,583,442 B2   2/2017   Fan et al.
9,620,454 B2   4/2017   Zhu et al.
(Continued)

FOREIGN PATENT DOCUMENTS

TW   202129888   8/2021

*Primary Examiner* — Farun Lu
(74) *Attorney, Agent, or Firm* — HAYNES AND BOONE, LLP

(57) ABSTRACT

Middle-of-line (MOL) interconnects that facilitate reduced capacitance and/or resistance and corresponding techniques for forming the MOL interconnects are disclosed herein. An exemplary MOL interconnect structure includes a device-level contact disposed in a first insulator layer and a ruthenium structure disposed in a second insulator layer disposed over the first insulator layer. The device-level contact physically contacts an integrated circuit feature, and the ruthenium structure physically contacts the device-level contact. An air gap separates sidewalls of the ruthenium structure from the second insulator layer. A top surface of the ruthenium structure is lower than a top surface of the second insulator layer. A via disposed in a third insulator layer extends below the top surface of the second insulator layer to physically contact the ruthenium structure. A remainder of a dummy contact spacer layer may separate the first insulator layer and the second insulator layer.

20 Claims, 28 Drawing Sheets

Related U.S. Application Data

(60) Provisional application No. 63/084,792, filed on Sep. 29, 2020.

(51) Int. Cl.
    *H01L 23/522*     (2006.01)
    *H01L 23/532*     (2006.01)
    *H01L 23/535*     (2006.01)

(52) U.S. Cl.
    CPC .... *H01L 21/7685* (2013.01); *H01L 21/76895* (2013.01); *H01L 23/5226* (2013.01); *H01L 23/53252* (2013.01); *H01L 23/53257* (2013.01); *H01L 23/5329* (2013.01); *H01L 23/535* (2013.01)

(58) Field of Classification Search
    CPC ........... H01L 23/5226; H01L 23/53252; H01L 23/53257; H01L 23/5329; H01L 23/535; H01L 21/76807; H01L 21/76885; H01L 23/4855; H01L 29/165; H01L 29/66636; H01L 29/7848; H01L 21/76805; H01L 23/481; H01L 23/5283; H01L 23/53295; H01L 23/485; H01L 23/53209
    See application file for complete search history.

(56) References Cited

U.S. PATENT DOCUMENTS

| | | |
|---|---|---|
| 9,786,607 B2 | 10/2017 | Fan et al. |
| 10,170,322 B1 | 1/2019 | Cheng et al. |
| 10,325,849 B2 | 6/2019 | Lee et al. |
| 2006/0030128 A1* | 2/2006 | Bu ...................... H01L 23/5222 438/462 |
| 2009/0065946 A1 | 3/2009 | Kojima |
| 2016/0013133 A1 | 1/2016 | Gu et al. |
| 2018/0026138 A1* | 1/2018 | Yamaguchi ......... H01L 29/4908 257/43 |
| 2018/0174886 A1 | 6/2018 | Chen et al. |
| 2019/0148153 A1* | 5/2019 | Cheng ............... H01L 21/28568 257/751 |
| 2019/0311986 A1 | 10/2019 | Amanapu et al. |
| 2020/0027783 A1* | 1/2020 | Kim .................. H01L 21/76877 |
| 2020/0105592 A1* | 4/2020 | Kuo ..................... H01L 23/5226 |
| 2021/0305155 A1* | 9/2021 | Bao ..................... H01L 23/5228 |

* cited by examiner

MIDDLE-OF-LINE INTERCONNECT STRUCTURE HAVING AIR GAP AND METHOD OF FABRICATION THEREOF

This application is a divisional application of U.S. patent application Ser. No. 17/147,177, filed Jan. 12, 2021, which is a non-provisional application of and claims benefit of U.S. Provisional Patent Application Ser. No. 63/084,792, filed Sep. 29, 2020, the entire disclosures of which are incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected IC devices per chip area) has generally increased while geometry size (i.e., dimensions and/or sizes of IC features and/or spacings between these IC features) has decreased. Typically, scaling down has been limited only by an ability to lithographically define IC features at the ever-decreasing geometry sizes. However, resistance-capacitance (RC) delay has arisen as a significant challenge as reduced geometry sizes are implemented to achieve ICs with faster operating speeds (e.g., by reducing distances traveled by electrical signals), thereby negating some of the advantages achieved by scaling down and limiting further scaling down of ICs. RC delay generally indicates delay in electrical signal speed through an IC resulting from a product of resistance (R) (i.e., a material's opposition to flow of electrical current) and capacitance (C) (i.e., a material's ability to store electrical charge). Reducing both resistance and capacitance is thus desired to reduce RC delay and optimize performance of scaled down ICs. Interconnects of ICs, which physically and/or electrically connect IC components and/or IC features of the ICs, are particularly problematic in their contributions to RC delay. A need thus exists for improvements in interconnects of ICs and/or methods of fabricating interconnects of ICs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
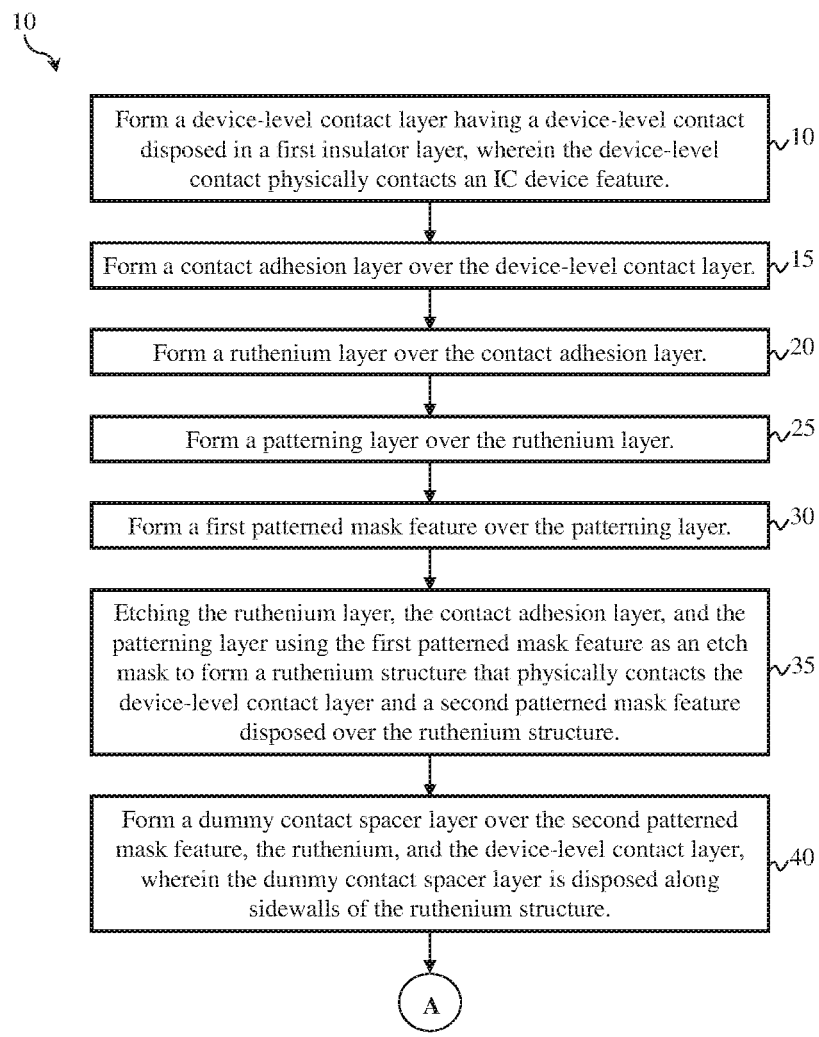
FIG. 1A and FIG. 1B are a flow chart of a method for fabricating a middle-of-line interconnect structure according to various aspects of the present disclosure.

The present disclosure relates generally to integrated circuit (IC) devices, and more particularly, to middle-of-line interconnects for IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-of-line (MOL or MEOL), and back-end-of-line (BEOL). FEOL generally encompasses processes related to fabricating IC devices (e.g., transistors, resistors, capacitors, and/or inductors) on a wafer. For example, FEOL processes include forming isolation features, gate structures, and source/drain features. BEOL generally encompasses processes related to fabricating metallization layers that electrically connect IC devices and/or components of the IC devices (e.g., gate structures and/or source/drain features) fabricated during FEOL to one another and/or external devices, thereby enabling operation of the IC devices. The metallization layers can route signals between the IC devices and/or the components of the IC devices and/or distribute signals (e.g., clock signals, voltage signals, and/or ground signals) to the IC devices and/or the components of the IC devices. Often, each metallization layer (also referred to as a metallization level) includes at least one interconnect structure disposed in an insulator layer, such as a metal line and a via disposed in a dielectric layer, where the via connects the metal line to a metal line of an interconnect in a different metallization layer. Metal lines and vias of the metallization layers can be referred to as BEOL features or global interconnects. MOL generally encompasses processes related to fabricating contacts that physically and/or electrically connect FEOL features (e.g., electrically active features of the IC devices) to a first metallization layer (level) formed during BEOL, such as contacts that connect a gate structure and/or source/drain features of a transistor to the first metallization layer. Contacts fabricated during MOL can be referred to as device-level contacts and/or local interconnects. Sometimes, MOL involves forming a multi-layer MOL interconnect structure in an insulator layer, such as a first contact and a second contact, where the first contact connects an electrically active feature of an IC device to the second contact and the second contact connects the first contact to the first metallization layer. The first contact and the second contact can be referred to as a device-level contact and a local contact (or interconnect), respectively.

As IC technologies progress towards smaller technology nodes, resistance and capacitance associated with global interconnects and local interconnects have presented challenges to reducing resistance-capacitance (RC) delay of the IC devices. For example, it has been observed that higher contact resistances and capacitances exhibited by MOL interconnect structures in advanced IC technology nodes can significantly delay (and, in some situations, prevent) signals from being routed efficiently to and from IC devices, such as transistors, negating any improvements in performance achieved by scaling down and limiting further scaling down of ICs. The present disclosure thus proposes an MOL interconnect structure that reduces both resistance and capacitance compared to conventional MOL interconnect structures, thereby decreasing RC delay and improving IC device performance for advanced IC technology nodes. The present disclose further proposes fabrication techniques that preserve the low resistance and capacitance characteristics of the proposed MOL interconnect structure.

Figure 1B:
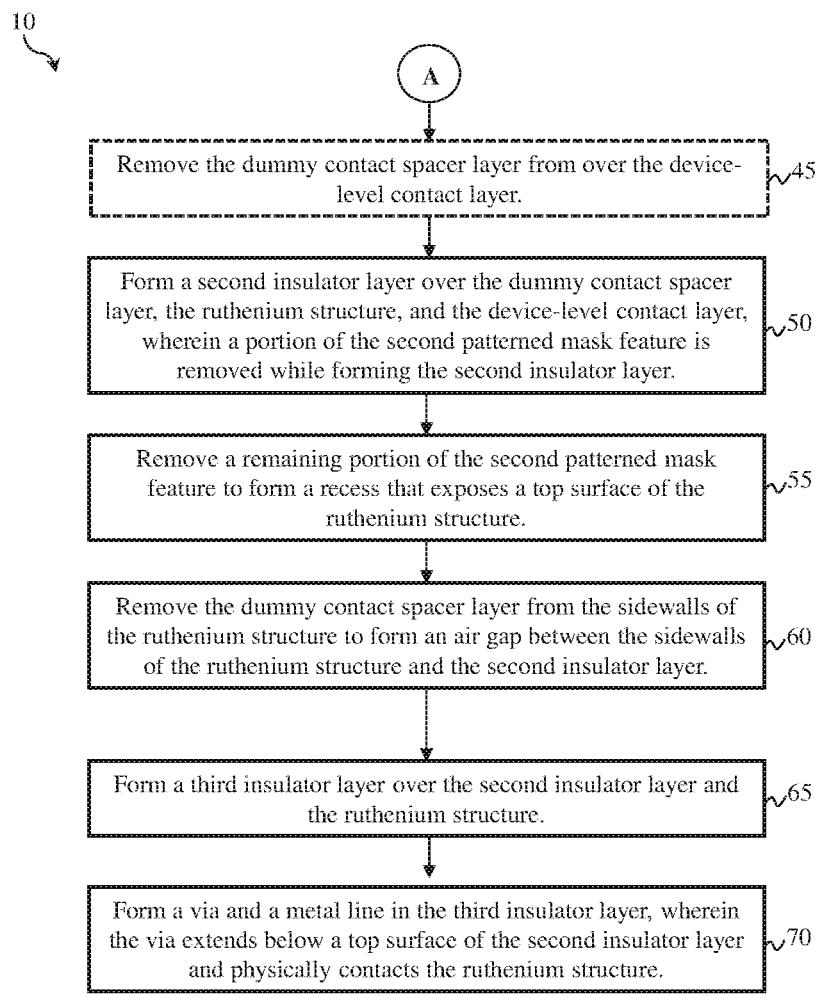

FIG. 1A and FIG. 1B are a flow chart of a method 10 for fabricating an MOL interconnect structure of an IC device according to various aspects of the present disclosure. The MOL interconnect structure fabricated by method 10 and its configuration relative to an overlying and connected BEOL interconnect structure can reduce capacitance and/or resistance associated with the IC device, thereby reducing associated RC delay. At block 15, method 10 begins with forming a device-level contact layer. The device-level contact layer has a device-level contact disposed in a first insulator layer, and the device-level contact physically contacts an IC device feature. Method 10 then proceeds with forming a contact adhesion layer over the device-level contact layer at block 15, forming a ruthenium layer over the contact adhesion layer at block 20, forming a patterning layer over the ruthenium layer at block 25, and forming a first patterned mask feature over the patterning layer at block 30. At block 35, method 10 includes etching the ruthenium layer, the contact adhesion layer, and the patterning layer using the first patterned mask feature as an etch mask to form a ruthenium structure that physically contacts the device-level contact layer and a second patterned mask feature disposed over the ruthenium structure. At block 40, a dummy contact spacer layer is formed over the second patterned mask feature, the ruthenium structure, and the device-level contact layer. The dummy contact spacer layer is disposed along sidewalls of the ruthenium structure. In some embodiments, method 10 includes removing the dummy contact spacer layer from over the device-level contact layer at block 45. At block 50, method 10 proceeds with forming a second insulator layer over the dummy contact spacer layer, the ruthenium structure, and the device-level contact layer. A portion of the second patterned mask feature is removed while forming the second insulator layer. At block 55, a remaining portion of the second patterned mask feature is removed to form a recess that exposes a top surface of the ruthenium structure. At block 60, method 10 includes removing the dummy contact spacer layer from the sidewalls of the ruthenium structure to form an air gap between the sidewalls of the ruthenium structure and the second insulator layer. At block 65, method 10 includes forming a third insulator layer over the second insulator layer and the ruthenium structure. A via and a metal line are formed in the third insulator layer at block 70. The via extends below a top surface of the second insulator layer and physically contacts the ruthenium structure. Additional steps can be provided before, during, and after method 10, and some of the steps described can be moved, replaced, or eliminated for additional embodiments of method 10. The discussion that follows illustrates MOL interconnect structures that can be fabricated according to various embodiments of method 10.

FIGS. 2-18 are fragmentary diagrammatic views of an integrated circuit (IC) device 100, in portion or entirety, at various stages of fabricating a middle-of-line (MOL) interconnect of IC device 100 (such as those associated with method 10 in FIG. 1), according to various aspects of the present disclosure. IC device 100 may be included in a microprocessor, a memory, and/or other IC device. In some embodiments, IC device 100 is a portion of an IC chip, a system on chip (SoC), or portion thereof, that includes various passive and active microelectronic devices such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various transistors may be planar transistors or non-planar transistors, such as fin-like FETs (FinFETs) or gate-all-around (GAA) transistors depending on design requirements of IC device 100. FIGS. 2-18 have been simplified for the sake of clarity to better understand the inventive concepts of the present disclosure. Additional features can be added in IC device 100, and some of the features described below can be replaced, modified, or eliminated in other embodiments of IC device 100.

Figure 2:
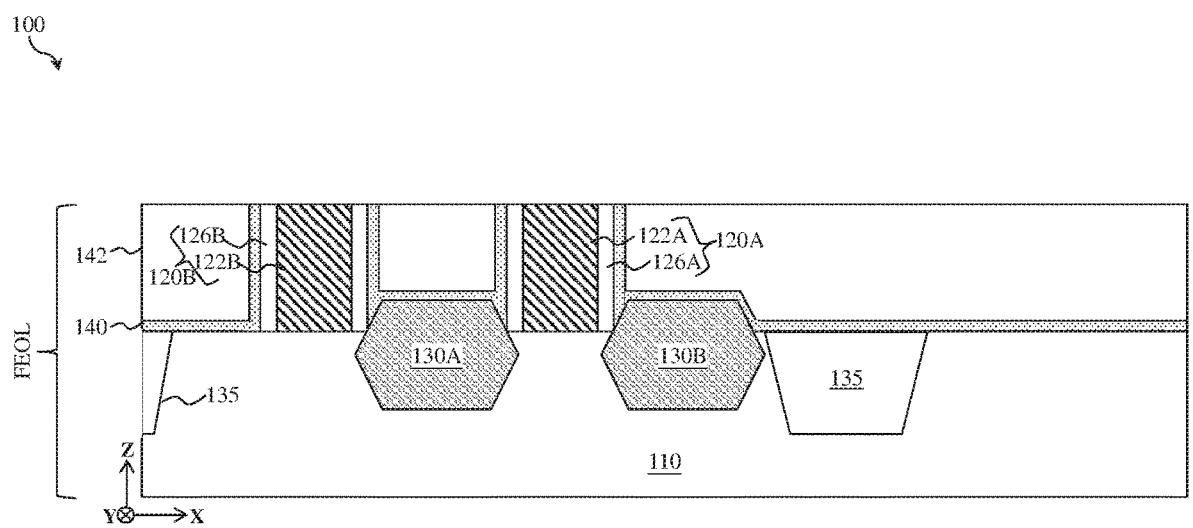
FIGS. 2-18 are fragmentary diagrammatic views of an integrated circuit device, in portion or entirety, at various stages of fabricating a middle-of-line interconnect structure, such as the method for fabricating a middle-of-line interconnect structure of an integrated circuit device of FIG. 1, according to various aspects of the present disclosure.

Turning to FIG. 2, IC device 100 has undergone FEOL processing where various IC devices, IC features, and/or IC components have been fabricated on a substrate (wafer) 110. In the depicted embodiment, substrate 110 includes silicon. Alternatively or additionally, substrate 110 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 110 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 110 can include doped regions formed by an ion implantation process, a diffusion process, and/or other suitable doping process depending on design requirements of IC device 100. In some embodiments, substrate 110 includes p-type doped regions (for example, p-type wells) doped with p-type dopants, such as boron, indium, other p-type dopant, or combinations thereof. In some embodiments, substrate 110 includes n-type doped regions (for example, n-type wells) doped with n-type dopants, such as phosphorus, arsenic, other n-type dopant, or combinations thereof. In some embodiments, substrate 110 includes doped regions formed with a combination of p-type dopants and n-type dopants. The various doped regions can be formed directly on and/or in substrate 110, for example, providing a p-well structure, an n-well structure, a dual-well structure, a raised structure, or combinations thereof.

In the depicted embodiment, the various IC features and/or IC components include a gate structure 120A and a gate structure 120B disposed over substrate 110, where gate structure 120A has a metal gate (MG) stack 122A and gate spacers 126A and gate structure 120B has a metal gate stack 122B and gate spacers 126B. In furtherance of the depicted embodiment, the various IC features and/or IC components include an epitaxial source/drain feature 130A, an epitaxial source/drain feature 130B, a contact etch stop layer (CESL) 140, and an interlayer dielectric (ILD) layer 1402, which are described further below. In some embodiments, a transistor of IC device 100 includes gate structure 120A disposed between a source region (e.g., epitaxial source/drain feature 130A) and a drain region (e.g., epitaxial source/drain feature 130B), where a channel region is defined in substrate 110 between the source region and the drain region. Gate structure 120A engages the channel region, such that current can flow between the source region and the drain region (collectively referred to as source/drain regions) (i.e., between epitaxial source/drain feature 130A and epitaxial source/drain feature 130B) during operation. In some embodiments, another transistor of IC device 100 includes gate structure 120B disposed between a source region and a drain region, where a channel region is defined in substrate 110 between the source region and the drain region. In some embodiments, gate structure 120A and/or gate structure 120B are formed over a fin structure (e.g., a semiconductor fin extending from substrate 110), such that gate structure 120A and/or gate structure 120B wrap a portion of the fin structure and interpose a respective source region and a respective drain region of the fin structure. In such embodiments, gate structure 120A and/or gate structure 120B engage a respective channel region defined in the fin structure. In FIG. 2, the various IC components and their respective configurations is merely exemplary. The present disclosure contemplates IC device 100 having any combination of IC components and/or IC devices and any configuration of such IC components and/or IC devices fabricated by FEOL processing.

Metal gate stacks 122A, 122B are configured to achieve desired functionality according to design requirements of IC device 100, such that metal gate stack 122A of gate structure 120A may include the same or different layers and/or materials as metal gate stack 122B of gate structure 120B. In some embodiments, metal gate stacks 122A, 122B include a gate dielectric (for example, a gate dielectric layer) and a gate electrode (for example, a work function layer and a bulk (or fill) conductive layer). Metal gate stacks 122A, 122B may include numerous other layers, for example, capping layers, interface layers, diffusion layers, barrier layers, hard mask layers, or combinations thereof. In some embodiments, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric materials, or combinations thereof. High-k dielectric material generally refers to dielectric materials having a high dielectric constant (k value) relative to a dielectric constant of silicon dioxide (k≈3.9). For example, high-k dielectric material has a dielectric constant greater than about 3.9. In some embodiments, the gate dielectric layer is a high-k dielectric layer. The gate electrode includes a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (such as an n-type work function or a p-type work function), and the conductive bulk layer is a conductive layer formed over the work function layer. In some embodiments, the work function layer includes n-type work function materials, such as Ti, Ag, Mn, Zr, TaAl, TaAlC, TiAlN, TaC, TaCN, TaSiN, other suitable n-type work function materials, or combinations thereof. In some embodiments, the work function layer includes a p-type work function material, such as Ru, Mo, Al, TiN, TaN, WN, $ZrSi_2$, $MoSi_2$, $TaSi_2$, $NiSi_2$, WN, other suitable p-type work function materials, or combinations thereof. The bulk conductive layer includes a suitable conductive material, such as Al, W, and/or Cu. The bulk conductive layer may include polysilicon, Ti, Ta, metal alloys, other suitable materials, or combinations thereof.

Metal gate stacks 122A, 122B are formed by deposition processes, lithography processes, etching processes, other suitable processes, or combinations thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plasma enhanced ALD (PEALD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof. Metal gate stacks 122A, 122B are fabricated according to a gate last process, a gate first process, or a hybrid gate last/gate first process. In gate last processes, gate structures 120A, 120B include dummy gate stacks that are subsequently, partially or completely, replaced with metal gate stacks 122A, 122B, respectively. The dummy gate stacks include, for example, an interfacial layer (including, for example, silicon oxide) and a dummy gate electrode layer (including, for example, polysilicon). In such embodiments, the dummy gate electrode layer is removed, thereby forming gate openings that are subsequently filled with metal gate stacks 122A, 122B.

Gate spacers 126A, 126B are disposed adjacent to (for example, along sidewalls of) metal gate stacks 122A, 122B, respectively. Gate spacers 126A, 126B are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, a dielectric layer including silicon and nitrogen, such as a silicon nitride layer, can be deposited over substrate 110 and subsequently anisotropically etched to form gate spacers 126A, 126B. In some embodiments, gate spacers 126A, 126B include a multilayer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to metal gate stacks 122A, 122B. In such embodiments, the various sets of spacers can include materials having different etch rates. For example, a first dielectric layer including silicon and oxygen (for example, silicon oxide) can be deposited over substrate 110 and subsequently anisotropically etched to form a first spacer set adjacent to metal gate stacks 122A, 122B (or dummy metal gate stacks, in some embodiments), and a second dielectric layer including silicon and nitrogen (for example, silicon nitride) can be deposited over substrate 110 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in substrate 110 before and/or after forming gate spacers 126A, 126B, depending on design requirements of IC device 100.

Epitaxial source features and epitaxial drain features (referred to as epitaxial source/drain features), such as epitaxial source/drain feature 130A and epitaxial source/drain feature 130B are disposed in source/drain regions of substrate 110. In some embodiments, a semiconductor material is epitaxially grown on and/or from substrate 110 to form epitaxial source/drain features 130A, 130B over source/drain regions of substrate 110. In some embodiments, an etching process is performed on source/drain regions of substrate 110 to form source/drain recesses, where epitaxial source/drain features 130A, 130B are grown to fill the source/drain recesses. In some embodiments, where substrate 110 represents a portion of a fin structure, epitaxial source/drain features 130A, 130B wrap source/drain regions of the fin structure and/or are disposed in source/drain recesses of the fin structure depending on design requirements of IC device 100. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 110. Epitaxial source/drain features 130A, 130B are doped with n-type dopants and/or p-type dopants. In some embodiments, epitaxial source/drain features 130A, 130B are epitaxial layers including silicon and/or carbon, where the silicon-comprising epitaxial layers or the silicon-carbon-comprising epitaxial layers are doped with phosphorous, other n-type dopant, or combinations thereof. In some embodiments, epitaxial source/drain 130A, 130B are epitaxial layers including silicon and germanium, where the silicon-and-germanium-compromising epitaxial layers are doped with boron, other p-type dopant, or combinations thereof. In some embodiments, epitaxial source/drain features 130A, 130B include materials and/or dopants that achieve desired tensile stress and/or compressive stress in the channel regions. In some embodiments, epitaxial source/drain features 130A, 130B are doped during deposition by adding impurities to a source material of the epitaxy process. In some embodiments, epitaxial source/drain features 130A, 130B are doped by an ion implantation process subsequent to a deposition process. In some embodiments, annealing processes are performed to activate dopants in epitaxial source/drain features 130A, 130B and/or other source/drain regions of IC device 100 (for example, HDD regions and/or LDD regions).

Isolation features, such as an isolation features 135, can be formed over and/or in substrate 110 to isolate various regions, such as device regions, of IC device 100. For example, isolation features 135 define and electrically isolate active device regions and/or passive device regions from each other. Isolation features 135 include silicon oxide, silicon nitride, silicon oxynitride, other suitable isolation material (for example, including silicon, oxygen, nitrogen, carbon, or other suitable isolation constituent), or combinations thereof. Isolation features 135 can include different structures, such as shallow trench isolation (STI) structures, deep trench isolation (DTI) structures, and/or local oxidation of silicon (LOCOS) structures. In some embodiments, isolation features 135 are formed by etching trenches in substrate 110 and filling the trench with insulator material (for example, using CVD or a spin-on glass process). A chemical mechanical polishing (CMP) process may be performed to remove excessive insulator material and/or planarize a top surface of isolation features. In some embodiments, isolation features 235 can be formed by depositing an insulator material over substrate 110 after forming fin structures (in some embodiments, such that the insulator material layer fills gaps (trenches) between the fin structures) and etching back the insulator material layer. In some embodiments, isolation features 135 include a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some embodiments, isolation features 135 include a dielectric layer disposed over a doped liner layer (including, for example, boron silicate glass (BSG) or phosphosilicate glass (PSG)).

CESL 140 is disposed over substrate 110, gate structures 120A, 120B (in particular, along sidewalls of gate spacers 126A, 126B), epitaxial source/drain features 130A, 130B, and isolation features 235. ILD layer 142 is disposed over CESL 140. ILD layer 142 includes a dielectric material including, for example, silicon oxide, silicon nitride, silicon oxynitride, tetraethyl orthosilicate (TEOS) oxide, PSG, BPSG, low-k dielectric material, other suitable dielectric material, or combinations thereof. Low-k dielectric material generally refers to dielectric materials having a low dielectric constant relative to the dielectric constant of silicon dioxide. For example, low-k dielectric material has a dielectric constant less than about 3.9. In some examples, low-k dielectric material has a dielectric constant less than about 2.5, which can be referred to as extreme low-k dielectric material. Exemplary low-k dielectric materials include fluorosilicate glass (FSG), carbon doped silicon oxide, Black Diamond® (Applied Materials of Santa Clara, Calif.), Xerogel, Aerogel, amorphous fluorinated carbon, Parylene, BCB, SiLK (Dow Chemical, Midland, Mich.), polyimide, other low-k dielectric material, or combinations thereof. In the depicted embodiment, ILD layer 142 includes a low-k dielectric material and is generally referred to as a low-k dielectric layer. CESL 140 includes a material different than ILD layer 142, such as a dielectric material that is different than the dielectric material of ILD layer 142. ILD layer 142 and/or CESL 140 can include a multilayer structure having multiple dielectric materials. In the depicted embodiment, where ILD layer 142 includes silicon and oxygen (for example, SiCOH, $SiO_x$, or other silicon-and-oxygen comprising material) (and can thus be referred to as a silicon oxide layer), CESL 140 includes silicon and nitrogen and/or carbon (for example, SiN, SiCN, SiCON, SiON, SiC, and/or SiCO) (and can thus be referred to as a silicon nitride layer). ILD layer 142 and/or CESL 140 are formed over substrate 110 by a deposition process, such as CVD, PVD, ALD, HDPCVD, MOCVD, RPCVD, PECVD, LPCVD, ALCVD, APCVD, PEALD, other suitable methods, or combinations thereof. In some embodiments, ILD layer 142 is formed by a flowable CVD (FCVD) process that includes, for example, depositing a flowable material over substrate 110 and converting the flowable material to a solid material by a suitable technique, such as thermal annealing and/or treating the flowable material with ultraviolet radiation. Subsequent to the deposition of ILD layer 142 and/or CESL 140, a CMP process and/or other planarization process is performed, such that ILD layer 142, CESL 140, and/or gate structures 120A, 120B have substantially planar surfaces.

Figure 3:
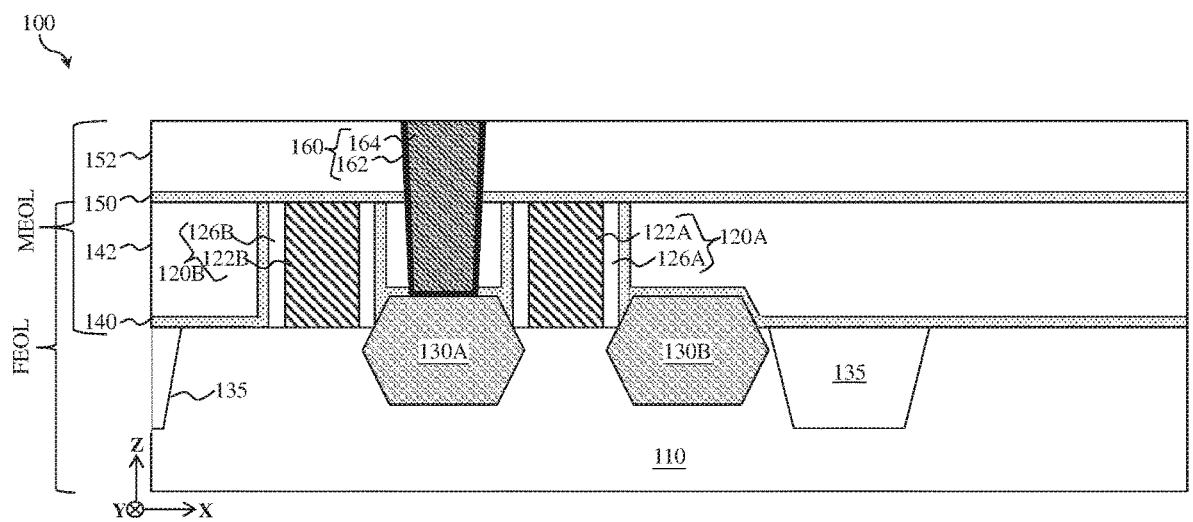

Turning to FIG. 3, MOL processing begins with forming device-level contacts, such as metal-to-poly (MP) contacts, which generally refer to contacts to a gate structure (e.g., gate structures 120A, 120B), and metal-to-device (MD) contacts, which generally refer to contacts to an electrically active region of IC device 100 (e.g., epitaxial source/drain features 130A, 130B). Device-level contacts electrically and physically connect IC device features to local contacts (interconnects), which are further described below. The device-level contacts can collectively be referred to as a device-level contact layer disposed over substrate 110. Forming device-level contacts can include forming a CESL 150 over ILD layer 142, CESL 140, and gate structures 120A, 120B; forming an ILD layer 152 over CESL 150; and forming a source/drain contact 160 (i.e., a device-level contact) that extends through ILD layer 152, CESL 150, ILD layer 142, and CESL 140 to physically contact epitaxial source/drain feature 130A. CESL 150 is similar to CESL 140, and ILD layer 152 is similar to ILD layer 142. CESL 150 and/or ILD layer 152 can thus be configured and formed as described with reference to CESL 140 and ILD layer 142 above. For example, CESL 150 can include silicon and nitrogen and/or carbon (for example, SiN, SiCN, SiCON, SiON, SiC, and/or SiCO) (and can thus be referred to as a silicon nitride layer), and ILD layer 152 can include silicon and oxygen (for example, SiCOH, $SiO_x$, or other silicon-and-oxygen comprising material) (and can thus be referred to as a silicon oxide layer or an oxide layer). Source/drain contact 160 includes a contact barrier layer 162 and a contact bulk layer 164 that is disposed over contact barrier layer 162. Contact barrier layer 162 includes a material that promotes adhesion between a surrounding dielectric material (here, CESL 140, ILD layer 142, CESL 150, and/or ILD layer 152) and contact bulk layer 164. The material of contact barrier layer 162 may further prevent diffusion of metal constituents from source/drain contact 160 into the surrounding dielectric material. In some embodiments, contact barrier layer 162 includes titanium, titanium alloy, tantalum, tantalum alloy, cobalt, cobalt alloy, ruthenium, ruthenium alloy, molybdenum, molybdenum alloy, palladium, palladium alloy, other suitable constituent configured to promote and/or enhance adhesion between a metal material and a dielectric material and/or prevent diffusion of metal constituents from the metal material to the dielectric material, or combinations thereof. For example, contact barrier layer 162 includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, contact barrier layer 162 includes multiple layers. For example, contact barrier layer 162 may include a first sub-layer that includes titanium and a second sub-layer that includes titanium nitride. In another example, contact barrier layer 162 may include a first sub-layer that includes tantalum and a second sub-layer that includes tantalum nitride. Contact bulk layer 164 includes tungsten, ruthenium, cobalt, copper, aluminum, iridium, palladium, platinum, nickel, low resistivity metal constituent, alloys thereof, or combinations thereof. In the depicted embodiment, contact bulk layer 164 includes tungsten, ruthenium, and/or cobalt. In some embodiments, source/drain contact 160 does not include contact barrier layer 162 (i.e., source/drain contact 160 is barrier-free), such that contact bulk layer 164 physically contacts CESL 140, ILD layer 142, CESL 150, and/or ILD layer 152. In some embodiments, source/drain contact 160 is partially barrier-free, where contact barrier layer 162 is disposed between only a portion of contact bulk layer 164 and the dielectric layer. In some embodiments, contact bulk layer 164 includes multiple layers.

Forming source/drain contact 160 can include performing a lithography and etching process (such as described herein) to form a contact opening that extends through ILD layer 152, CESL 150, ILD layer 142, and/or CESL 140 to expose epitaxial source/drain feature 130A; performing a first deposition process to form a contact barrier material over ILD layer 152 that partially fills the contact opening; and performing a second deposition process to form a contact bulk material over the contact barrier material, where the contact bulk material fills a remainder of the contact opening. In such embodiments, the contact barrier material and the contact bulk material are disposed in the contact opening and over a top surface of ILD layer 152. The first deposition process and the second deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. In some embodiments, contact barrier layer 162 has a substantially uniform thickness along sidewalls and bottom of the contact opening. Contact barrier layer 162 may thus be formed by a conformal deposition process. In some embodiments, a silicide layer is formed over epitaxial source/drain feature 130A before forming the contact barrier material (e.g., by depositing a metal layer over epitaxial source/drain feature 130A and heating IC device 100 to cause constituents of epitaxial source/drain feature 130A to react with metal constituents of the metal layer). In some embodiments, the silicide layer includes a metal constituent (e.g., nickel, platinum, palladium, vanadium, titanium, cobalt, tantalum, ytterbium, zirconium, other suitable metal, or combinations thereof) and a constituent of epitaxial source/drain feature 130A (e.g., silicon and/or germanium). A CMP process and/or other planarization process is performed to remove excess contact bulk material and contact barrier material, for example, from over the top surface of ILD layer 152, resulting in source/drain contact 160 (in other words, contact barrier layer 162 and contact bulk layer 164 filling the contact opening). The CMP process planarizes a top surface of source/drain contact 160, such that in some embodiments, a top surface of ILD layer 152 and a top surface of source/drain contact 160 form a substantially planar surface.

Turning to FIGS. 4-16, MOL processing continues with forming a local contact (interconnect) layer over the device-level contact layer, where the local contact layer is configured to exhibit less capacitance and/or resistance than conventional local contact layers. The local contact layer includes local contacts that physically and electrically connect device-level contacts to a first metallization (routing) layer of a multilayer interconnect (MLI) feature of IC device 100. The local contact layer may be referred to as a metal zero (M0) layer and metal contacts (also referred to as metal lines) thereof may be referred to as M0 contacts/lines. As described further below, the first metallization layer includes metal lines and vias, where the vias physically and electrically connect the local contacts to the metal lines. The metal lines of the first metallization layer can collectively be referred to as a metal one (M1) layer (and individually referred to as M1 metal lines), and the vias of the first metallization layer can collectively be referred to as a via zero (V0) layer (and individually referred to as V0 vias). The V0 layer is a bottommost via layer of the MLI feature. An MOL interconnect structure thus generally refers to a device-level contact of the device-level contact layer and a local contact of the local contact layer that combine to connect an IC feature, such as epitaxial source/drain feature 130A, to a BEOL interconnect structure of the first metallization layer (e.g., a metal line disposed over a via, where the via connects the local contact to the metal line). The MLI feature electrically couples various devices (for example, transistors, resistors, capacitors, and/or inductors) and/or components (for example, gate structures and/or source/drain features) of IC device 100, such that the various devices and/or components can operate as specified by design requirements of IC device 100. During operation of IC device 100, the device-level contact layer, the local contact layer, the first metallization layer, and/or other metallization layers of the MLI feature can route signals between the IC devices and/or the components of the IC devices and/or distribute signals (e.g., clock signals, voltage signals, and/or ground signals) to the IC devices and/or the components of the IC devices. In some embodiments, the device-level contact layer and/or the local contact layer are considered a portion of the MLI feature.

Figure 4:
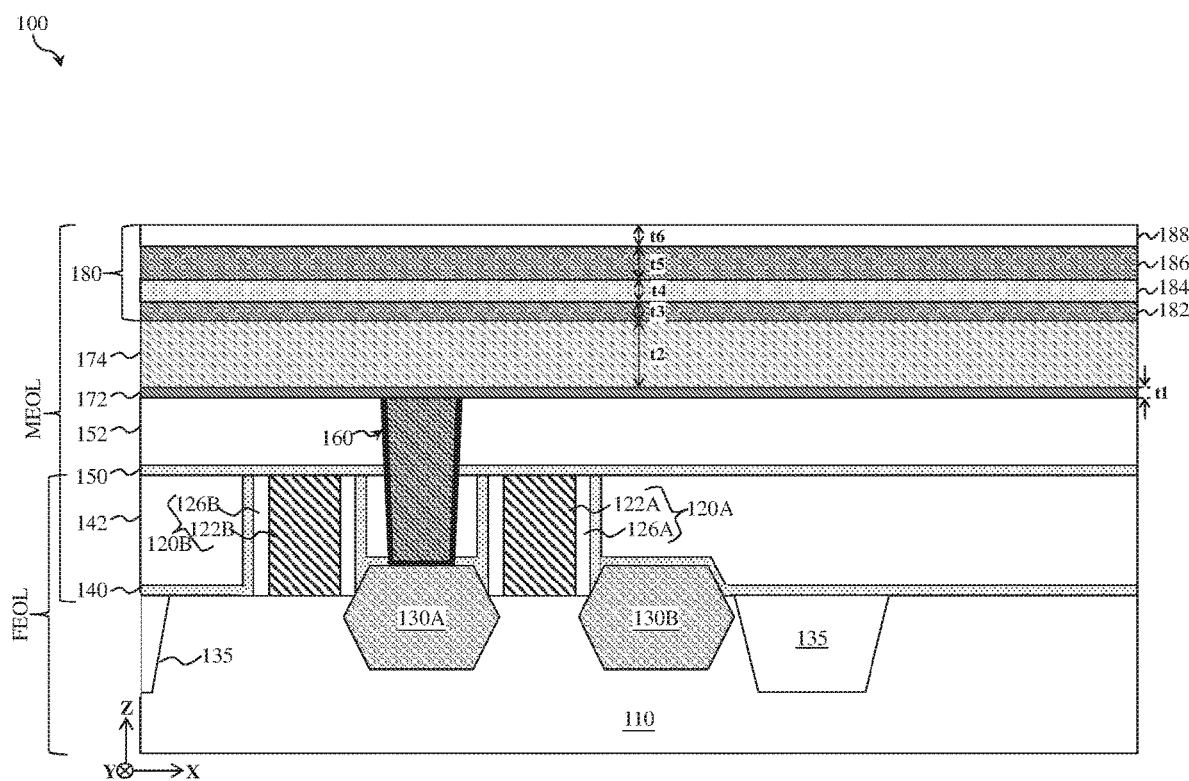

Turning to FIG. 4, MOL processing includes forming an adhesion layer 172 over ILD layer 152, forming a ruthenium layer 174 over adhesion layer 172, and forming a mask layer 180 over ruthenium layer 174. Adhesion layer 172 includes a material that promotes adhesion between ruthenium layer 174 and source/drain contact 160 and/or other underlying local contacts. For example, adhesion layer 172 includes titanium, titanium alloy, tantalum, tantalum alloy, cobalt, cobalt alloy, ruthenium, ruthenium alloy, molybdenum, molybdenum alloy, other suitable constituent configured to promote and/or enhance adhesion between ruthenium layer 174 and underlying local contacts, or combinations thereof. In the depicted embodiment, adhesion layer 172 includes titanium and nitrogen, such as a titanium nitride layer. In some embodiments, adhesion layer 172 includes titanium, such as a titanium layer. In some embodiments, adhesion layer 172 includes multiple layers. For example, adhesion layer 172 can include a titanium sub-layer and a titanium nitride sub-layer disposed over the titanium sub-layer. Ruthenium layer 174 includes ruthenium or ruthenium alloy (for example, including titanium, tantalum, tungsten, cobalt, copper, aluminum, iridium, palladium, platinum, nickel, low resistivity metal constituent, other suitable ruthenium alloying constituent, alloys thereof, or combinations thereof). In some embodiments, a ruthenium concentration is uniform throughout ruthenium layer 174. In some embodiments, a ruthenium concentration is graded throughout ruthenium layer 174, for example, increasing or decreasing along its thickness from a bottommost surface of ruthenium layer 174 proximate source/drain contact 160 to a topmost surface of ruthenium layer 174 proximate mask layer 180. In some embodiments, a ruthenium concentration in ruthenium layer 174 has any profile configured to minimize resistance and/or capacitance contributions from ruthenium layer 174 in a subsequently formed ruthenium structure, as described below. In FIG. 4, adhesion layer 172 has a thickness t1, and ruthenium layer 174 has a thickness t2. In some embodiments, thickness t1 is about 1 nm to about 5 nm. In some embodiments, thickness t2 is about 10 nm to about 50 nm. In some embodiments, a ratio of thickness t1 to thickness t2 is about 1:2 to about 1:50. Adhesion layer 172 and/or ruthenium layer 174 are formed by CVD, PVD, ALD, HDPCVD, MOCVD, RPCVD, PECVD, LPCVD, ALCVD, APCVD, PEALD, plating, other suitable methods, or combinations thereof. In some embodiments, adhesion layer 172 is deposited over ILD layer 152 by ALD, and ruthenium layer 174 is deposited over adhesion layer 172 by CVD.

In the depicted embodiment, mask layer 180 includes multiple layers, such as a metal-comprising mask layer 182, a dielectric-comprising mask layer 184, a metal-comprising mask layer 186, and a dielectric-comprising mask layer 188. Metal-comprising mask layer 182 has a thickness t3, dielectric-comprising mask layer 184 has a thickness t4, metal-comprising mask layer 186 has a thickness t5, and dielectric-comprising mask layer 188 has a thickness t6. In some embodiments, thickness t3, thickness t4, thickness t5, and thickness t6 are about 10 nm to about 30 nm. The present disclosure contemplates any configuration or thickness t3, thickness t4, thickness t5, and thickness t6 (for example, one thickness greater than another thickness, etc.) depending on processing and/or design considerations. Metal-comprising mask layers 182, 186 include metal, such as tungsten, titanium, other suitable metal, or combinations thereof. In some embodiments, metal-comprising mask layers 182, 186 include the same material. In some embodiments, metal-comprising mask layers 182, 186 include different materials. In some embodiments, metal-comprising mask layers 182 and/or metal-comprising mask layer 186 is a tungsten layer. In some embodiments, metal-comprising mask layers 182 and/or metal-comprising mask layer 186 is a titanium nitride layer. Dielectric-comprising mask layers 184, 188 include silicon, oxygen, nitrogen, carbon, other suitable dielectric constituent, or combinations thereof. In some embodiments, dielectric-comprising mask layers 184, 188 include the same material. In some embodiments, dielectric-comprising mask layers 184, 188 include different materials. In some embodiments, dielectric-comprising mask layer 184 and/or dielectric-comprising mask layer 188 is a silicon oxide layer. In some embodiments, dielectric-comprising mask layer 184 and/or dielectric-comprising mask layer 188 is a silicon nitride layer. In some embodiments, dielectric-comprising mask layer 184 and/or dielectric-comprising mask layer 188 is a silicon carbide layer. In some embodiments, dielectric-comprising mask layer 184 and/or dielectric-comprising mask layer 188 is a silicon carbonitride layer. In the depicted embodiment, metal-comprising mask layers 182, 186 are carbon-doped tungsten (WDC) layers, dielectric-comprising mask layer 184 is a silicon nitride layer, and dielectric-comprising mask layer 188 is a silicon oxide layer. The present disclosure contemplates mask layer 180 having any number of materials, constituents, and/or layers suitable to achieve patterning of ruthenium layer 174 and adhesion layer 172 and formation of contact air spacers as described herein.

Figure 5:
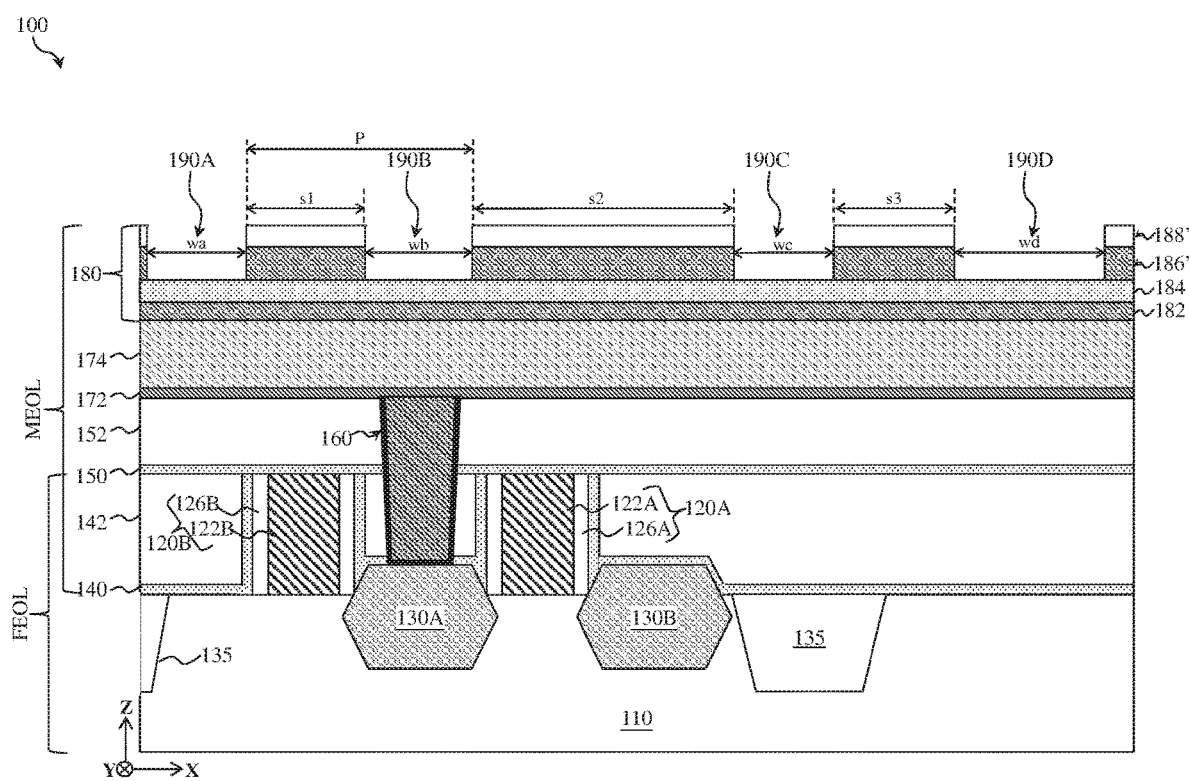

Turning to FIG. 5, a patterning process is performed on mask layer 180 to form various openings, such as an opening 190A, an opening 190B, an opening 190C, and an opening 190D, that extend through dielectric-comprising mask layer 188 and metal-comprising mask layer 186. The patterning process thus partially patterns mask layer 180, in particular, patterning dielectric-comprising mask layer 188 and metal-comprising mask layer 186, which are referred to hereinafter as a patterned dielectric-comprising mask layer 188' and a patterned metal-comprising mask layer 186', respectively. Patterned dielectric-comprising mask layer 188' and patterned metal-comprising mask layer 186' define a local contact pattern (also referred to as a metal zero (M0) pattern) to be formed over ILD layer 152 during MEOL processing. For example, openings 190A-190D define locations and dimensions of local contacts (M0 contacts) to be formed over ILD layer 152, such as a width wa, a width wb, a width wc, and a width wd of local contacts. In some embodiments, width wa, width wb, width wc, and/or width wd are about 8 nm to about 1,000 nm. In furtherance of the example, portions of patterned dielectric-comprising mask layer 188' and patterned metal-comprising mask layer 186' disposed between openings 190A-190D define spacing of local contacts, such as a spacing s1, a spacing s2, and a spacing s3. In some embodiments, spacing s1, spacing s2, and/or spacing s3 are about 8 nm to about 1,000 nm. In some embodiments, patterned dielectric-comprising mask layer 188' and patterned metal-comprising mask layer 186' define a pitch of the local contact pattern. In some embodiments, a pitch P of the local contact pattern generally refers to a sum of a width of a local contact and a spacing between directly adjacent local contacts (for example, pitch P=width wb+spacing s1) (i.e., a lateral distance between edges of directly adjacent local contacts). In some embodiments, pitch P of the local contact pattern is about 16 nm to about 2,000 nm. In some embodiments, the pitch of the local contact pattern is defined as a lateral distance between centers of directly adjacent local contacts. In some embodiments, widths, spacings, and/or pitches of the local contact pattern are minimum widths, minimum spacings, and/or minimum pitches, which generally refer to smallest dimensions that can be fabricated on a wafer using a fabrication process. For example, a minimum pitch of local contacts is a lateral distance between centers or edges of two minimum width local contacts separated by a minimum spacing.

In some embodiments, the patterning process includes a lithography process and/or an etching process. The lithography process can include forming a resist layer over mask layer 180 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of mask layer (here, dielectric-comprising mask layer 188 and metal-comprising mask layer 186) using the patterned resist layer as an etch mask. In some embodiments, a first etching process removes portions of dielectric-comprising mask layer 188 using the patterned resist layer as an etch mask to form patterned dielectric-comprising mask layer 188', and a second etching process removes portions of metal-comprising mask layer 186 using the patterned resist layer and/or patterned dielectric-comprising mask layer 188' as an etch mask to form patterned metal-comprising mask layer 186'. The etching process can include a dry etching process, a wet etching process, other suitable etching process, or combinations thereof. In some embodiments, the etching process is a reactive ion etching (RIE) process. After the etching process, the patterned resist layer is removed, for example, by a resist stripping process or other suitable process. In some embodiments, the patterning process is a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, the patterning process implements directed self-assembly (DSA) techniques. Further, in some embodiments, the exposure process can implement maskless lithography, electron-beam writing, and/or ion-beam writing for patterning the resist layer. In the depicted embodiment, the patterning process is an SADP process and/or includes an EUV lithography and etching process (i.e., directly patterns mask layer 180 using a patterned EUV resist layer).

Figure 6:
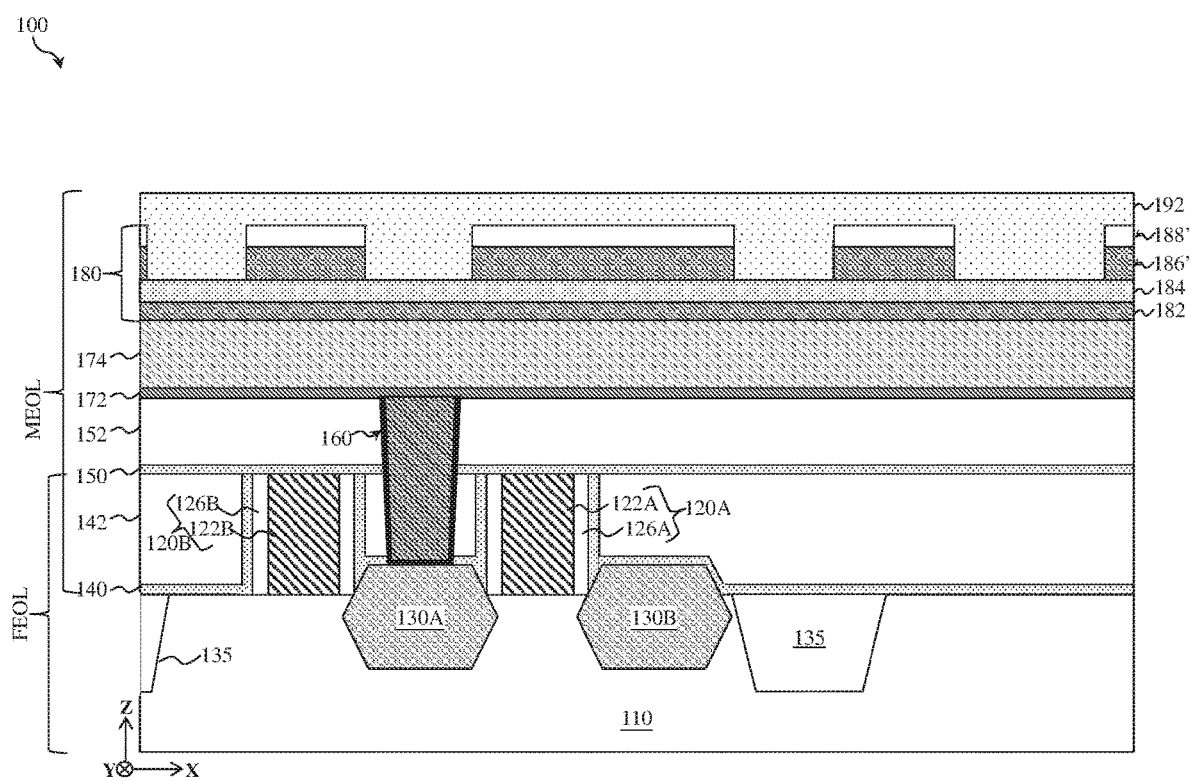

Turning to FIG. 6, an oxide material 192 is formed over mask layer 180 that fills openings 190A-190D. In some embodiments, oxide material 192 is deposited by an FCVD process that includes, for example, depositing a flowable oxide material (for example, in a liquid state) over IC device 100 and converting the flowable oxide material into a solid oxide material by an annealing process. The flowable oxide material can flow into openings 190A-190D and conform to exposed surfaces of IC device 100, enabling void free filling of openings 190A-190D. For example, the FCVD process introduces a silicon-comprising precursor and an oxidizer (collectively referred to as reactants) into a deposition chamber, where the silicon-comprising precursor and the oxidizer react and condense onto exposed surfaces of IC device 100 (for example, patterned dielectric-comprising mask layer 188') to form the flowable oxide material. In some embodiments, the flowable oxide material is a flowable silicon-and-oxygen comprising material. In some embodiments, the silicon-containing precursor is a silazene-based precursor (e.g., polysilazane, silylamine, ditrisilylamine, dimethylsilane, trimethylsilane, tetramethylsilane, diethylsilane, other suitable silicon-containing precursor, or combinations thereof) and the oxidizer includes oxygen (e.g., $O_2$, $O_3$, hydrogen peroxide ($H_2O_2$), $H_2O$, other suitable oxygen-containing constituents, or combinations thereof). In some embodiments, the silicon-containing precursor, such as the silazene-based precursor, is introduced into the deposition chamber in a liquid or vapor state. In some embodiments, the oxidizer is excited to an ionized state by plasma, such that the oxidizer is introduced into the deposition chamber in a plasma state. In some embodiments, the silicon-containing precursor and/or the oxidizer is mixed with a carrier gas (including, for example, hydrogen, helium, argon, nitrogen, xenon, krypton, neon, other suitable constituent, or combinations thereof) before or after introduction into the deposition chamber. In the depicted embodiment, the annealing process converts the flowable silicon-and-oxygen material into a silicon-and-oxygen containing layer, such as a silicon oxide layer. Oxide material 192 may thus be referred to as a silicon oxide layer. In some embodiments, the annealing process is a thermal annealing that heats IC device 100 to a temperature that can facilitate conversion of the flowable oxide material into the solid oxide material. In some embodiments, the annealing process exposes the flowable oxide material to UV radiation. In some embodiments, oxide material 192 is deposited by a high aspect ratio deposition (HARP) process. The HARP process can implement a TEOS precursor and an $O_3$ precursor. In some embodiments, oxide material 192 is deposited by HDPCVD, which can implement an $SiH_4$ precursor and an $O_2$ precursor. The present disclosure contemplates implementing other deposition processes and/or precursors to form oxide material 192.

Figure 7:
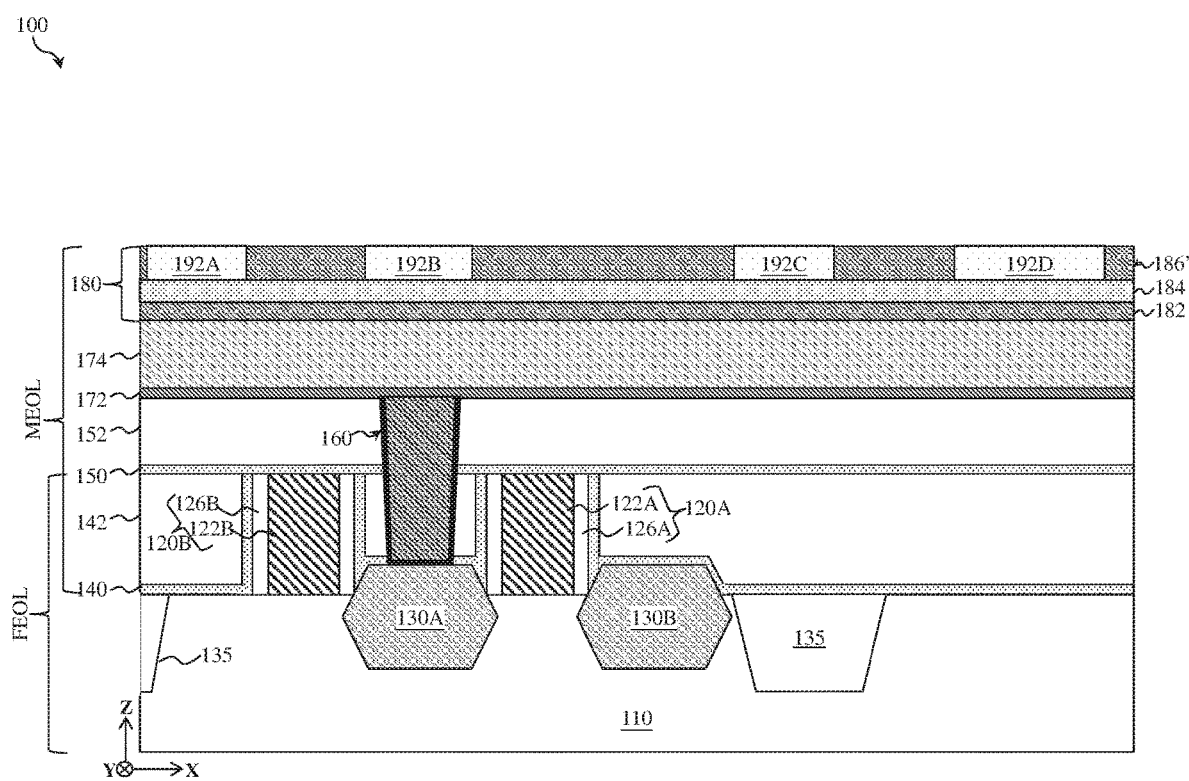

The deposition process overfills openings 190A-190D. A thickness of oxide material 192 is thus greater than a sum of thickness t6 of patterned dielectric-comprising mask layer 188' and thickness t5 of patterned metal-comprising mask layer 186'. Turning to FIG. 7, a CMP process and/or other planarization process is performed on oxide material 192 to reduce the thickness of oxide material 192. Patterned metal-comprising mask layer 186' can function as a planarization (e.g., CMP) stop layer, such that the CMP process is performed until reaching and exposing patterned metal-comprising mask layer 186'. The CMP process thus removes patterned dielectric-comprising mask layer 188' and any of oxide material 192 that is disposed over a top surface of patterned metal-comprising mask layer 186'. Remaining oxide material 192 forms an oxide feature 192A, an oxide feature 192B, an oxide feature 192C, and an oxide feature 192D. Oxide features 192A-192D are embedded within patterned metal-comprising mask layer 186', form a portion of mask layer 180, and can collectively be referred to as a patterned oxide layer. In some embodiments, the CMP process planarizes a top surface of oxide features 192A-192D and patterned metal-comprising mask layer 186', such that top surfaces of oxide features 192A-192D and the top surface of patterned metal-comprising mask layer 186' are substantially planar. In some embodiments, a thickness of oxide features 192A-192D is substantially equal to thickness t5 of patterned metal-comprising mask layer 186'. In some embodiments, a thickness of oxide features 192A-192D is less or greater than thickness t5 of patterned metal-comprising mask layer 186'. In some embodiments, an annealing process is performed after the CMP to further cure and/or densify oxide features 192A-192D.

Figure 8:
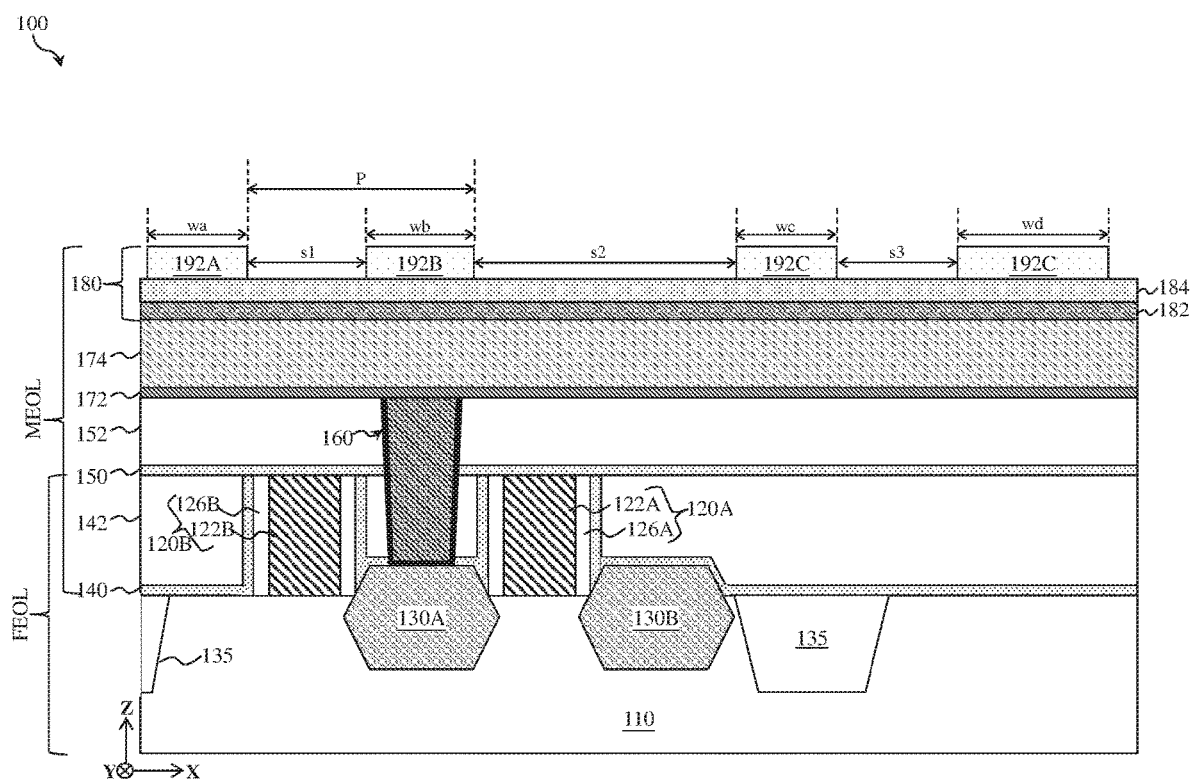

Turning to FIG. 8, patterned metal-comprising mask layer 186' is selectively removed from mask layer 180, leaving oxide features 192A-192D defining the local contact pattern over dielectric-comprising mask layer 184. Each of oxide features 192A-192D corresponds with a respective one of openings 190A-190D, and thus each of oxide features 192A-192D corresponds with a local contact to be formed for IC device 100. In FIG. 8, oxide features 192A-192D respectively have width wa, width wb, width wc, and width wd, and have spacing s1, spacing s2, and spacing s3 therebetween. In some embodiments, an etching process is configured to selectively remove patterned metal-comprising mask layer 186' with respect to oxide features 192A-192B and dielectric-comprising mask layer 184. In other words, the etching process substantially removes patterned metal-comprising mask layer 186' but does not remove, or does not substantially remove, oxide features 192A-192D and dielectric-comprising mask layer 184. In the depicted embodiment, an etchant is selected for the etching process that etches tungsten-comprising material (i.e., patterned metal-comprising mask layer 186') at a higher rate than oxide material (i.e., oxide features 192A-192D) and silicon nitride material (i.e., dielectric-comprising mask layer 184) (i.e., the etchant has a high etch selectivity with respect to tungsten-comprising material). In some embodiments, an etchant is selected for the etch process that etches metal material (i.e., patterned metal-comprising mask layer 186') at a higher rate than dielectric material (i.e., oxide features 192A-192D and/or dielectric-comprising mask layer 184) (i.e., the etchant has a high etch selectivity with respect to metal material). The etching process is a dry etching process, a wet etching process, or a combination thereof.

Figure 9:
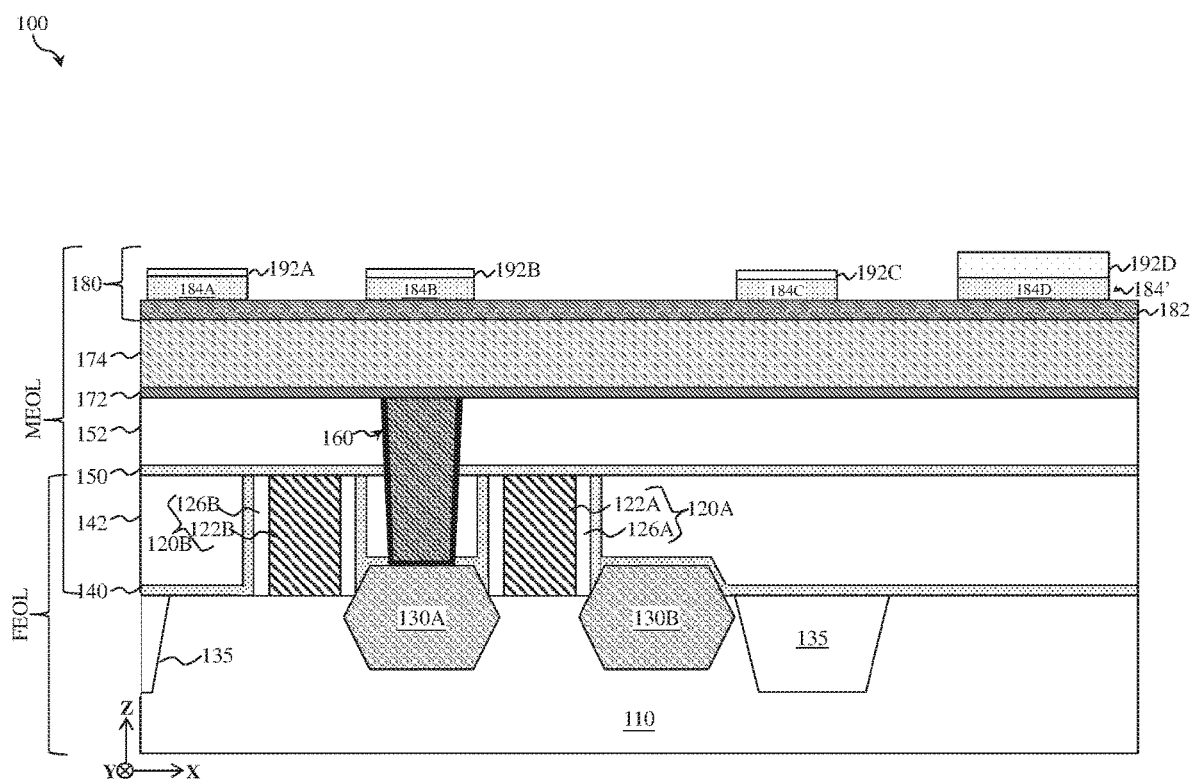

Turning to FIG. 9, an etching process is performed on dielectric-comprising mask layer 184 using oxide features 192A-192D as an etch mask. For example, the etching process removes portions of dielectric-comprising mask layer 184 that are not covered by oxide features 192A-192D (i.e., exposed portions of dielectric-comprising mask layer 184), leaving a dielectric-comprising mask feature 184A, a dielectric-comprising mask feature 184B, a dielectric-comprising mask feature 184C, and a dielectric-comprising mask feature 184D under oxide features 192A-192D, respectively (and collectively referred to as a patterned dielectric-comprising mask layer 184'). The etching process is configured to selectively remove dielectric-comprising mask layer 184 with respect to metal-comprising mask layer 182. In other words, the etching process substantially removes dielectric-comprising mask layer 184 but does not remove, or does not substantially remove, metal-comprising mask layer 182. For example, an etchant is selected for the etch process that etches silicon nitride material (i.e., dielectric-comprising mask layer 184) at a higher rate than tungsten-comprising material (i.e., metal-comprising mask layer 182) (i.e., the etchant has a high etch selectivity with respect to silicon nitride material). In some embodiments, the etching process is further configured to selectively remove dielectric-comprising mask layer 184 with respect to oxide features 192A-192D. In other words, the etching process can also substantially remove dielectric-comprising mask layer 184 but not remove, or not substantially remove, oxide features 192A-192D. For example, an etchant is selected for the etch process that also etches silicon nitride material (i.e., dielectric-comprising mask layer 184) at a higher rate than oxide material (i.e. oxide features 192A-192D). In some embodiments, an etch selectivity of the etchant for dielectric-comprising mask layer 184 over metal-comprising mask layer 182 is greater than an etch selectivity of the etchant for dielectric-comprising mask layer 184 over oxide features 192A-192D. In such embodiments, the etching process may partially etch oxide features 192A-192D, such as depicted. In some embodiments, the etching process may not uniformly etch oxide features 192A-192D, such that oxide features 192A-192D have different thicknesses over dielectric-comprising mask features 184A-184D, respectively. In some embodiments, a thickness of one or more of oxide features 192A-192D is less than thickness t6 after the etching process. In some embodiments, one or more of oxide features 192A-192D is completely removed by the etching process. In some embodiments, an etchant is selected for the etch process that etches dielectric material (i.e., dielectric-comprising mask layer 184) at a higher rate than metal material (i.e., metal-comprising mask layer 182) (i.e., the etchant has a high etch selectivity with respect to dielectric material). The etching process is a dry etching process, a wet etching process, or a combination thereof.

Figure 10:
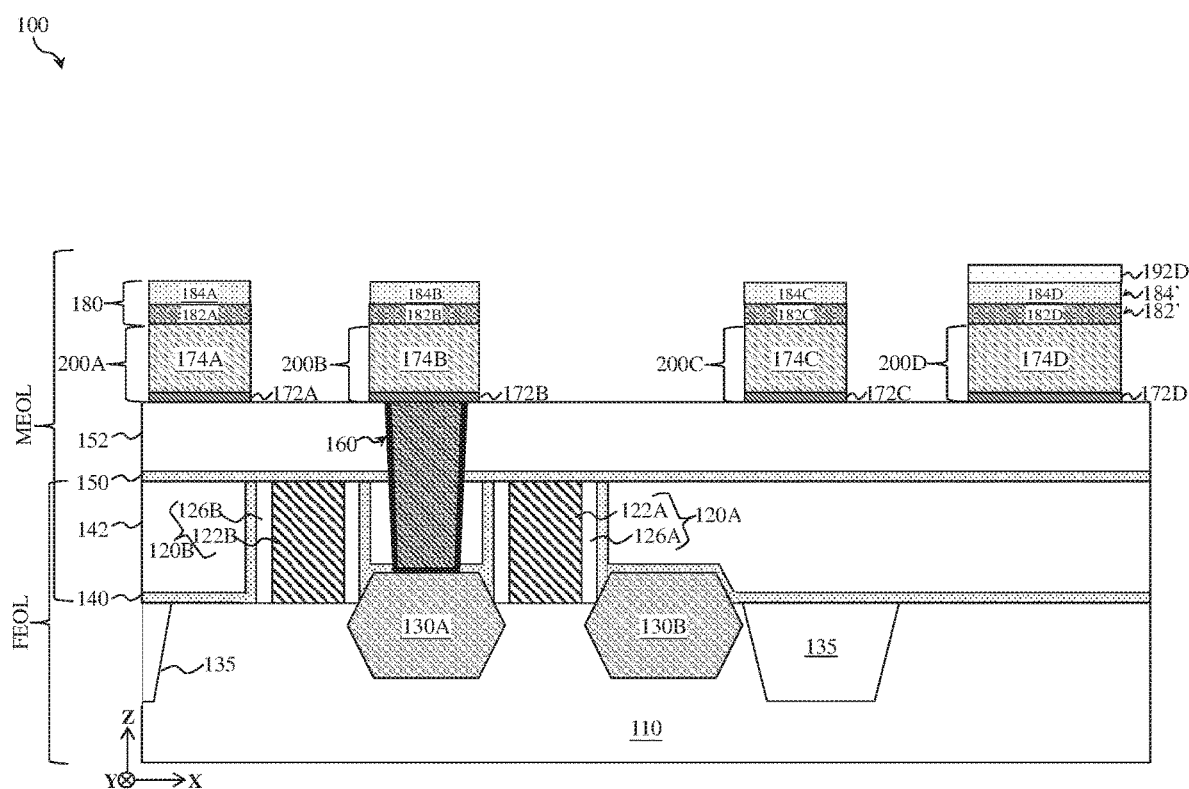

Turning to FIG. 10, an etching process is performed on metal-comprising mask layer 182, ruthenium layer 174, and adhesion layer 172 using patterned dielectric-comprising mask layer 184' (and/or, in some embodiments, oxide features 192A-192D) as an etch mask. For example, the etching process removes portions of metal-comprising mask layer 182 that are not covered by patterned dielectric-comprising mask layer 184' (i.e., exposed portions of metal-comprising mask layer 182), leaving a metal-comprising mask feature 182A, a metal-comprising mask feature 182B, a metal-comprising mask feature 182C, and a metal-comprising mask feature 182D under dielectric-comprising mask features 184A-184D, respectively (and collectively referred to as a patterned metal-comprising mask layer 182'). The etching process also removes portions of ruthenium layer 174 and adhesion layer 172 that are not covered by patterned dielectric-comprising mask layer 184' (i.e., exposed portions of ruthenium layer 174 and adhesion layer 172) to form a ruthenium structure 200A (including a ruthenium plug 174A and an adhesion layer 172A), a ruthenium structure 200B (including a ruthenium plug 174B and an adhesion layer 172B), a ruthenium structure 200C (including a ruthenium plug 174C and an adhesion layer 172C), and a ruthenium structure 200D (including a ruthenium plug 174D and an adhesion layer 172D). Ruthenium structures 200A-200D can alternatively be referred to as ruthenium contacts, ruthenium M0 structures, ruthenium-comprising contacts, ruthenium local contacts, or combinations thereof. The etching process is configured to selectively remove metal-comprising mask layer 182, ruthenium layer 174, and adhesion layer 172 with respect to patterned dielectric-comprising mask layer 184'. In other words, the etching process substantially removes metal-comprising mask layer 182, ruthenium layer 174, and adhesion layer 172 but does not remove, or does not substantially remove, patterned dielectric-comprising mask layer 184'. For example, an etchant is selected for the etch process that etches metal materials (i.e., metal-comprising mask layer 182, ruthenium layer 174, and adhesion layer 172) at a higher rate than silicon nitride material (i.e., patterned dielectric-comprising mask layer 184') (i.e., the etchant has a high etch selectivity with respect to metal materials). In some embodiments, the etching process is further configured to selectively remove oxide features 192A-192D with respect to patterned dielectric-comprising mask layer 184'. In other words, the etching process can also substantially remove oxide features 192A-192D but not remove, or not substantially remove, patterned dielectric-comprising mask layer 184'. For example, an etchant is selected for the etch process that also etches oxide material (i.e. oxide features 192A-192D) at a higher rate than silicon nitride material (i.e., patterned dielectric-comprising mask layer 184'). In some embodiments, an etch selectivity of the etchant for metal-comprising mask layer 182, ruthenium layer 174, and adhesion layer 172 over dielectric-comprising mask layer 184 is greater than an etch selectivity of the etchant for oxide features 192A-192D over patterned dielectric-comprising mask layer 184'. In such embodiments, the etching process may etch one or more of oxide features 192A-192D. For example, in the depicted embodiment, the etching process completely removes oxide features 192A-192C and further reduces a thickness of oxide feature 192D. The etching process is a dry etching process, a wet etching process, or a combination thereof. In some embodiments, the etching process includes multiple steps, such as a first etch step that selectively etches metal-comprising mask layer 182, a second etch step that selectively etches ruthenium layer 174, and a third etch step that selectively etches adhesion layer 172 (e.g., the first etch step, the second etch step, and the third etch step implement different etchants). In another example, various parameters of the etching process (e.g., etchant flow rates and/or etchant concentrations) are tuned to achieve different etch selectivity throughout the etching process, such that the etching process selectively and separately etches metal-comprising mask layer 182, ruthenium layer 174, and adhesion layer 172. In some embodiments, the etching process implements an etchant having minimal to no etching selectivity between metal-comprising mask layer 182, ruthenium layer 174, and/or adhesion layer 172.

Figure 11:
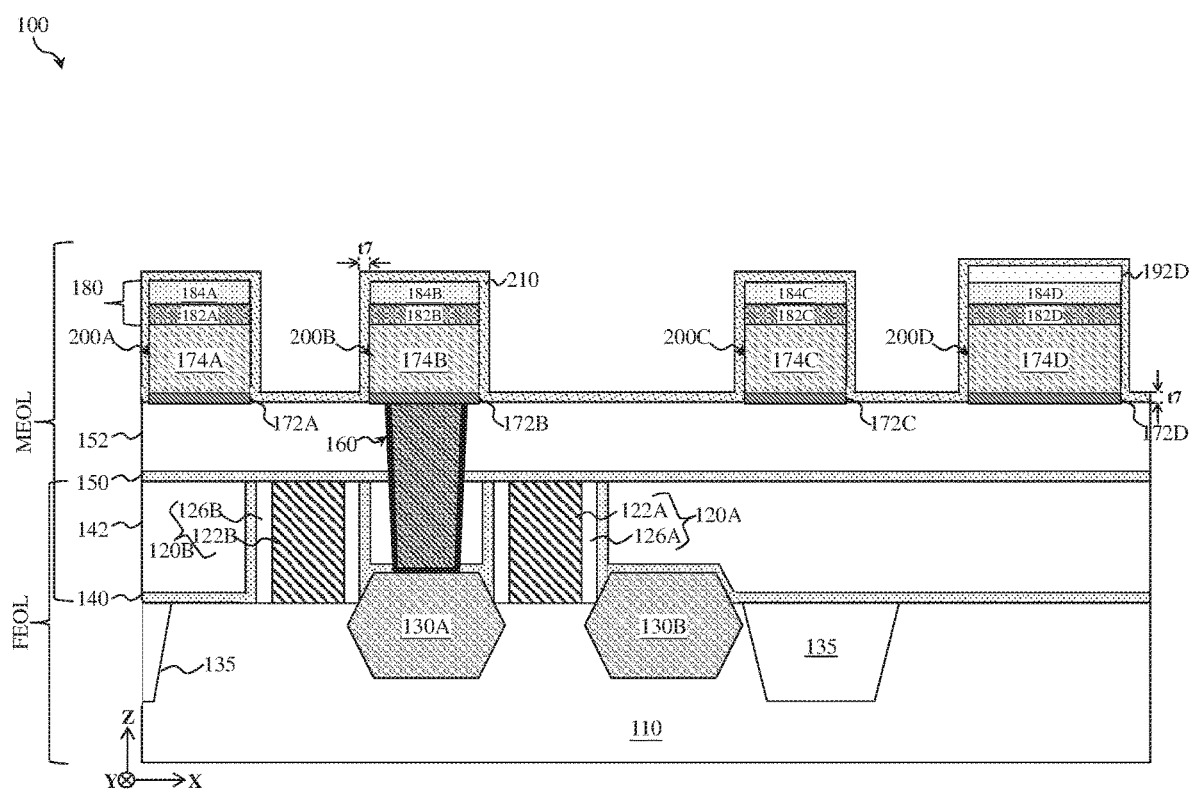

Turning to FIG. 11, a dummy contact spacer layer 210 (also referred to as a spacer layer) is formed over ruthenium structures 200A-200D and remainder of mask layer 180 (e.g., oxide feature 192D, dielectric-comprising mask features 184A-184D, and/or metal-comprising mask features 182A-182D) by a suitable deposition process, such as CVD, PVD, ALD, HDPCVD, MOCVD, RPCVD, PECVD, LPCVD, ALCVD, APCVD, other suitable methods, or combinations thereof. For example, dummy contact spacer layer 210 is disposed along sidewalls of ruthenium structures 200A-200D, top surfaces and sidewalls of a remainder of mask layer 180, and top surface of ILD layer 152. Dummy contact spacer layer 210 has a thickness t7 that is substantially uniform along sidewalls of ruthenium structures 200A-200D, top surfaces and sidewalls of the remainder of mask layer 180, and top surface of ILD layer 152. However, the present disclosure contemplates embodiments where thickness t7 of dummy contact spacer layer 210 varies, such as a tapered thickness along sidewalls of ruthenium structures 200A-200D. In some embodiments, thickness t7 is about 1 nm to about 8 nm. In some embodiments, thickness t7 along sidewalls of ruthenium structures 200A-200D is tailored to define dimensions of contact air spacers (gaps) for ruthenium structures 200A-200D. For example, parameters of the deposition process are tuned to ensure thickness t7 is about a target width for contact air spacers for ruthenium structures 200A-200D.

Dummy contact spacer layer 210 includes a material that is different than a material of ruthenium structures 200A-200D and a subsequently formed ILD layer to achieve etching selectivity during subsequent etching processes, such as those used to form contact air spacers for ruthenium structures 200A-200D. In other words, dummy contact spacer layer 210 and its surrounding layers include materials having distinct etching sensitivities to a given etchant. For example, dummy contact spacer layer 210 includes a material having an etch rate to an etchant that is greater than an etch rate of materials of ruthenium structures 200A-200D (here, ruthenium plugs 174A-174D and adhesion layers 172A-172D) and a subsequently formed ILD layer to the etchant. Dummy contact spacer layer 210 includes silicon, germanium, metal, oxygen, nitrogen, carbon, other suitable constituent, or combinations thereof. In the depicted embodiment, dummy contact spacer layer 210 is an amorphous silicon layer. In some embodiments, dummy contact spacer layer 210 is an amorphous carbon layer. In some embodiments, dummy contact spacer layer 210 is a silicon layer, a germanium layer, or a silicon germanium layer, which can be doped with a suitable dopant to achieve etching selectivity. In some embodiments, dummy contact spacer layer 210 is a polysilicon layer. In some embodiments, dummy contact spacer layer 210 includes metal and oxygen, where the metal can include aluminum, hafnium, titanium, copper, manganese, vanadium, other suitable metal, or combinations thereof. For example, the metal is titanium, and dummy contact spacer layer 210 is a titanium oxide layer. In some embodiments, dummy contact spacer layer 210 is a dielectric layer, such as a silicon nitride layer or a silicon carbonitride layer. In some embodiments, dopants (for example, p-type dopants, n-type dopants, or combinations thereof) are introduced into the dummy contact spacer material, such that dummy contact spacer layer 210 includes a doped material. In some embodiments, dummy contact spacer layer 210 is a BSG layer or a PSG layer. In some embodiments, dummy contact spacer layer 210 is a low-density silicon nitride layer, for example, relative to a subsequently formed CESL, which may be configured as a high-density silicon nitride layer. In some embodiments, dummy contact spacer layer 210 is a low-density silicon oxide layer, for example, relative to a subsequently formed ILD layer, which may be configured as a high-density silicon oxide layer. Degrees of density to achieve "high-density" and "low-density" can be configured to achieve desired etching selectivity for subsequent etch processes.

Figure 12:
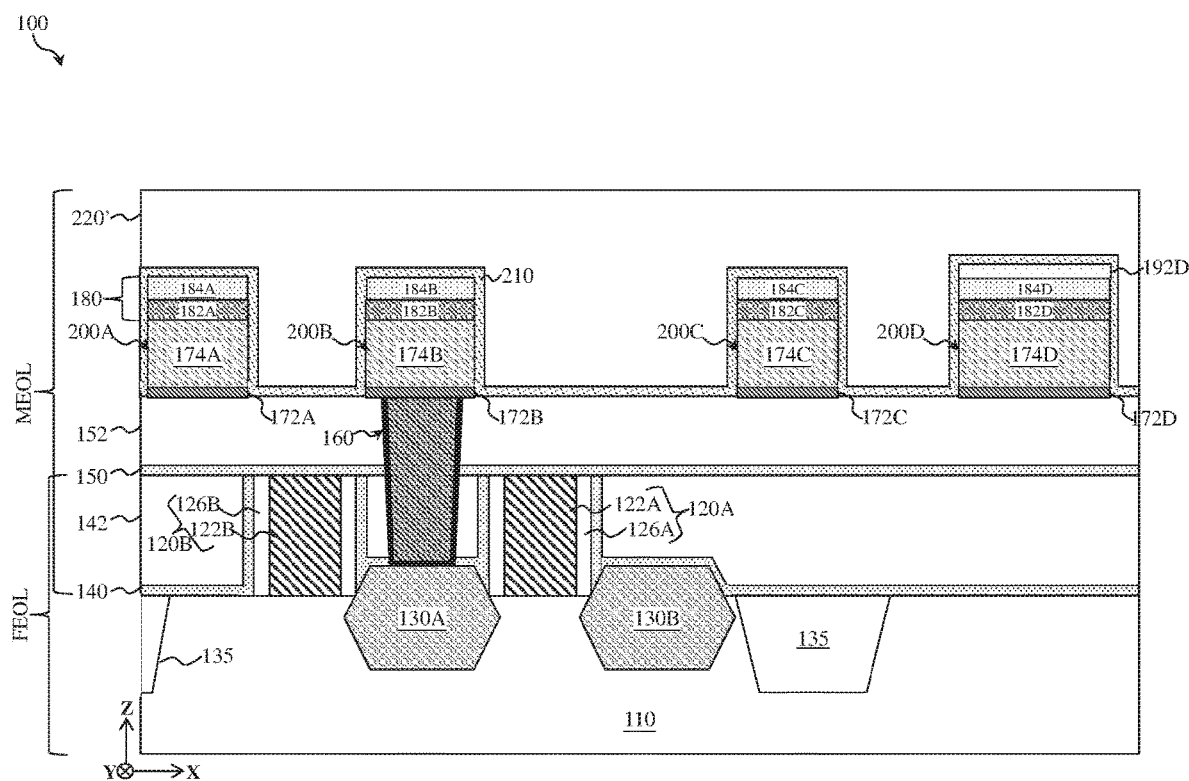
Figure 13:
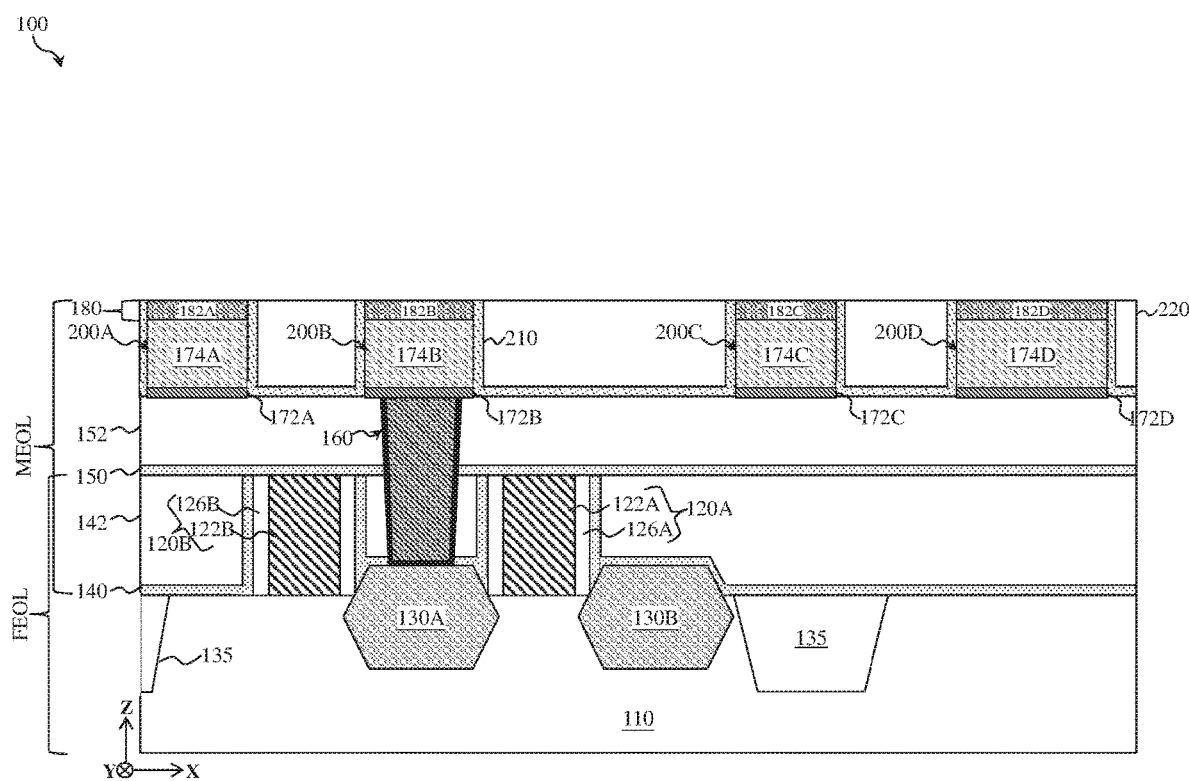

Turning to FIG. 12 and FIG. 13, processing continues with forming an ILD layer 220 of IC device 100. For example, in FIG. 12, a dielectric material 220' is formed over dummy contact spacer layer 210. Dielectric material 220' and dummy contact spacer layer 210 fill spaces between ruthenium structures 200A-200D. In the depicted embodiment, dielectric material 220' covers dummy contact spacer layer 210, ruthenium structures 200A-200D, and mask layer 180. A thickness of dielectric material 220' is thus greater than a sum of a thickness t7 of dummy contact spacer layer 210, a thickness of ruthenium structures 200A-200D (e.g., a sum of thickness t1 and thickness t2), and a thickness of mask layer 180 (e.g., a sum of thickness t3 and thickness t4). Dielectric material 220', and thus ILD layer 220, includes a dielectric material including, for example, silicon oxide, carbon doped silicon oxide, silicon nitride, silicon oxynitride, TEOS, PSG, BSG, BPSG, FSG, Black Diamond® (Applied Materials of Santa Clara, Calif.), xerogel, aerogel, amorphous fluorinated carbon, parylene, BCB-based dielectric material, SiLK (Dow Chemical, Midland, Mich.), polyimide, other suitable dielectric material, or combinations thereof. In some embodiments, dielectric material 220' includes a low-k dielectric material. In some embodiments, dielectric material 220' includes an ELK dielectric material, such as porous silicon dioxide material, silicon carbide material, and/or carbon-doped oxide (for example, a SiCOH-based material (having, for example, Si—CH$_3$ bonds)), each of which is tuned/configured to exhibit a dielectric constant less than about 2.5. In the depicted embodiment, dielectric material 220' includes silicon and oxygen (for example, SiCOH, SiO$_x$, or other silicon-and-oxygen comprising material) (and can thus be referred to as a silicon oxide layer or an oxide layer). Dielectric material 220' are formed by a deposition process, such as CVD, PVD, ALD, HDPCVD, MOCVD, RPCVD, PECVD, LPCVD, ALCVD, APCVD, PEALD, other suitable methods, or combinations thereof. In some embodiments, dielectric material 220' is formed by an FCVD process, such as described above with reference to oxide material 192'. For example, a flowable silicon-and-oxygen material is converted into a silicon-and-oxygen containing layer, such as a silicon oxide layer. In some embodiments, dielectric material 220' is formed by a HARP process, such as described above with reference to oxide material 192'. In some embodiments, dielectric material 220' is formed by HDPCVD, such as described above with reference to oxide material 192'.

Turning to FIG. 13, a CMP process and/or other planarization process is performed on dielectric material 220'. A remainder of dielectric material 220' after the CMP process forms ILD layer 220, as depicted, having ruthenium structures 200A-200D embedded therein. Patterned metal-comprising mask layer 182' can function as a CMP stop layer, such that the CMP process is performed until reaching and exposing patterned metal-comprising mask layer 182'. The CMP process thus removes portions of dielectric material 220', portions of dummy spacer layer 210, any remainder of oxide features 192A-192D (here, oxide feature 192D), and dielectric-comprising mask features 184A-184B that are disposed over a top surface of patterned metal-comprising mask layer 182'. The CMP process can planarize a top surface of ILD layer 220, top surfaces of dummy contact spacer layer 210, and top surfaces of metal-comprising mask features 182A-182D, such that in some embodiments, top surface of ILD layer 220, top surfaces of dummy contact spacer layer 210, and top surfaces of metal-comprising mask features 182A-182D are substantially planar after the CMP process. In some embodiments, an annealing process is performed after the CMP to further cure and/or densify ILD layer 220.

Figure 14:
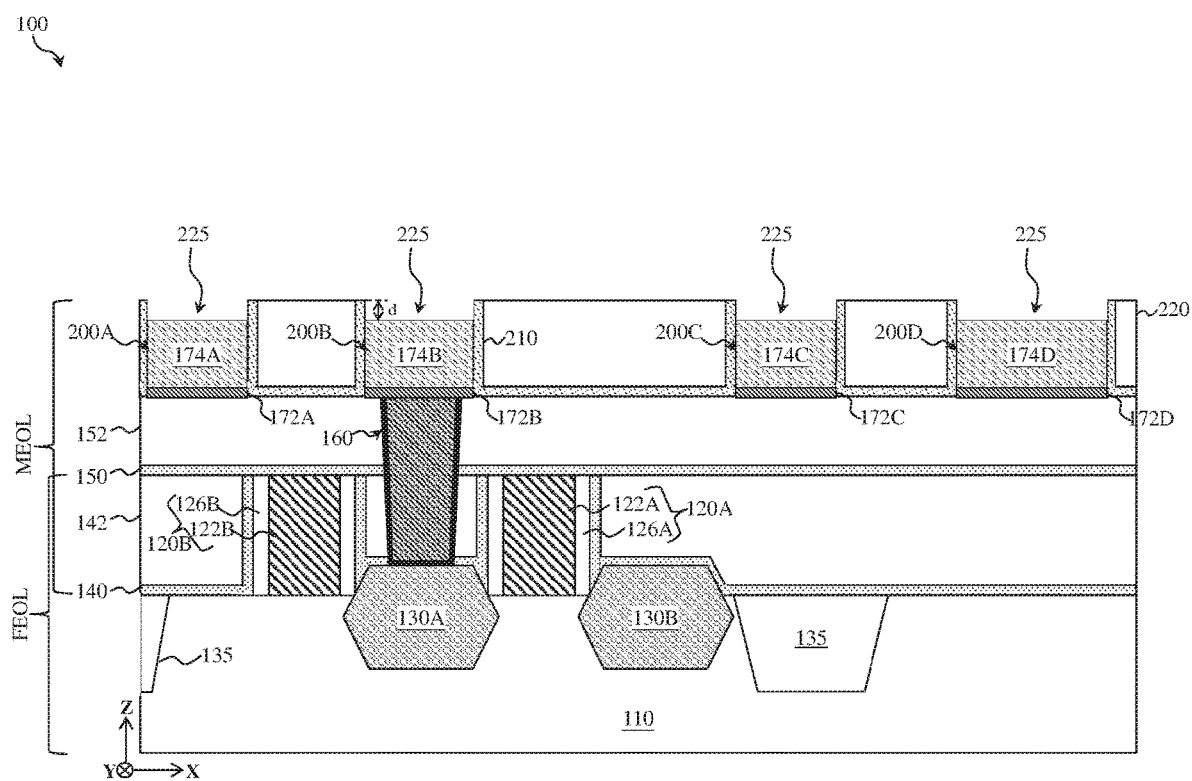

Turning to FIG. 14, patterned metal-comprising mask layer 182' (i.e., metal-comprising mask features 182A-182D) is removed from over ruthenium structures 200A-200D, thereby forming recesses (trenches) 225 having sidewalls defined by dummy contact spacer layer 210 and bottoms defined by top surfaces of ruthenium structures 200A-200D. Top surfaces of ruthenium structures 200A-200D are recessed from a top surface of ILD layer 220 by distance d, or put another way, a depth of recesses 225 is about distance d. In some embodiments, distance d is about 1 nm to about 20 nm. In some embodiments, an etching process is configured to selectively remove patterned metal-comprising mask layer 182' with respect to ruthenium structures 200A-200D, dummy contact spacer layer 210, and ILD layer 220. In other words, the etching process substantially removes patterned metal-comprising mask layer 182' but does not remove, or does not substantially remove, ruthenium structures 200A-200D, dummy contact spacer layer 210, and ILD layer 220. In the depicted embodiment, an etchant is selected for the etching process that etches tungsten-comprising material (i.e., patterned metal-comprising mask layer 182') at a higher rate than ruthenium-comprising material (i.e., ruthenium plugs 174A-174D), amorphous silicon material (i.e., dummy contact spacer layer 210), and oxide material (i.e., ILD layer 220) (i.e., the etchant has a high etch selectivity with respect to tungsten-comprising material). The etching process is a dry etching process, a wet etching process, or a combination thereof.

Figure 15:
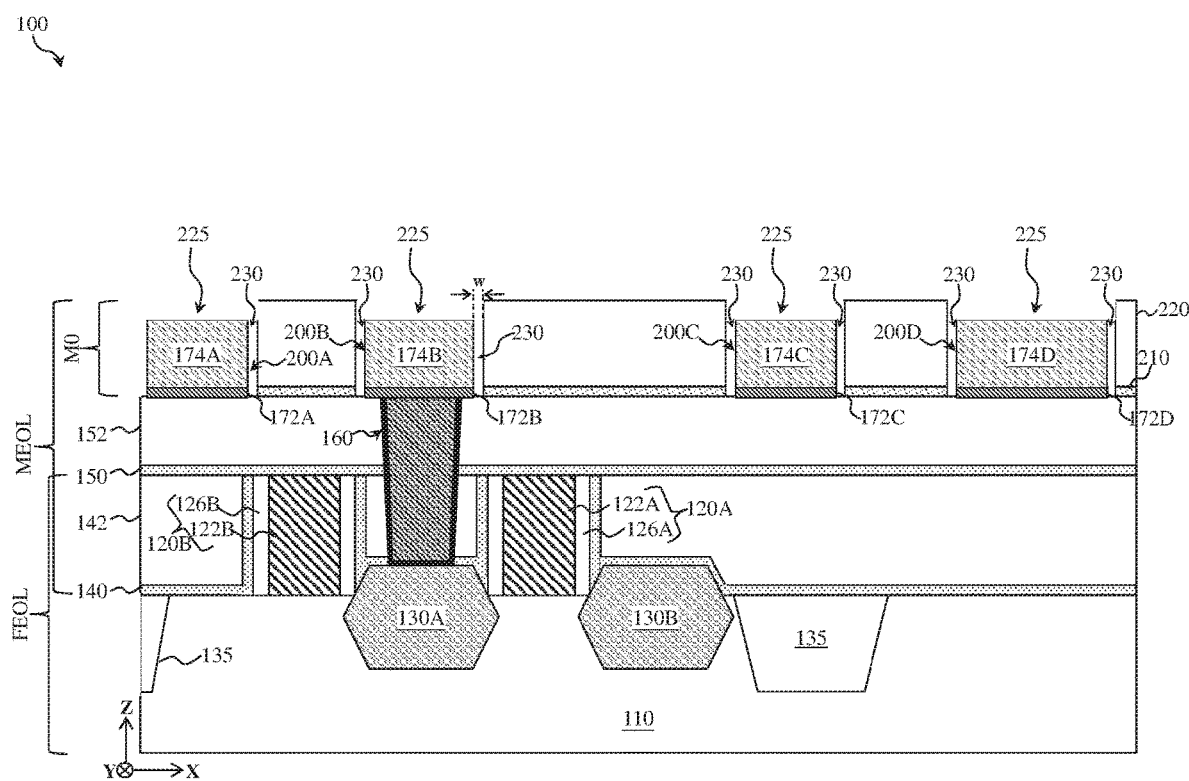

Turning to FIG. 15, an etching process is performed to selectively remove dummy contact spacer layer 210 and form air gaps 230 for ruthenium structures 200A-200D. Air gaps 230 are defined between ILD layer 220 and sidewalls of ruthenium structures 200A-200D. In the depicted embodiment, air gaps 230 have bottoms defined by ILD layer 152 and sidewalls defined by ILD layer 220. In some embodiments, such as depicted, sidewalls of air gaps 230 are further defined by portions of dummy contact spacer layer 220 remaining between ILD layer 152 and ILD layer 220. Accordingly, air gaps 230 are disposed along sidewalls of ruthenium structures 200A-200D and extend through ILD layer 220 and dummy contact spacer layer 210 to ILD layer 152, such that air gaps 230 surround ruthenium structures 200A-200D. Air gaps 230 have a width w defined along the x-direction. In the depicted embodiment, width w is substantially the same as thickness t7 of removed dummy contact spacer layer 210. In some embodiments, width w is about 1 nm to about 8 nm. The etching process is configured to selectively remove dummy contact spacer layer 210 with respect to ILD layer 220 and ruthenium structures 200A-200B. In other words, the etch process substantially removes dummy contact spacer layer 210 but does not remove, or does not substantially remove, ILD layer 220 and/or ruthenium structures 200A-200D. For example, an etchant is selected for the etch process that etches amorphous silicon material (i.e., dummy contact spacer layer 210) at a higher rate than metal-comprising material (i.e., ruthenium structures 200A-200D) and oxide material (i.e., ILD layer 220) (i.e., the etchant has a high etch selectivity with respect to amorphous silicon material). The etching process is a dry etching process, a wet etching process, or a combination thereof. In some embodiments, a dry etching process implements an etch gas that includes $Cl_2$, $NF_3$, $O_2$, $H_2$, $CH_4$, or combinations thereof, where constituents of the etch gas depend on compositions of dummy contact spacer layer 210, ruthenium structures 200A-200D, and ILD layer 220. In some embodiments, the dry etching process is configured to generate a plasma from any of the etch gases disclosed herein, such that the dry etch uses plasma-excited species for removing dummy spacer layer 210. In some embodiments, a wet etching process implements a wet etchant solution configured to selectively remove dummy contact spacer layer 210, where constituents of the wet etchant solution depend on compositions of dummy contact spacer layer 210, ruthenium structures 200A-200D, and ILD layer 220.

Because air has a dielectric constant that is about one ($k\approx 1$), which is lower than dielectric constants of insulating materials conventionally implemented for interconnect structures (for example, silicon oxide or silicon nitride), air gaps 230 reduce capacitance between ruthenium structures 200A-200D, capacitance between ruthenium structures 200A-200D and device-level contacts (e.g., device-level contact 160), and/or capacitance between ruthenium structures 200A-200D and subsequently formed BEOL interconnect structures (e.g., vias and metal lines). In some embodiments, MOL interconnect structures having ruthenium structures 200A-200D surrounded by air gaps 230 reduce parasitic capacitance by as much as 10% compared to MOL interconnect structures having ruthenium structures 200A-200D without air gaps. Further, because the disclosed MOL interconnect structures replace copper with ruthenium (i.e., ruthenium structures 200A-200D), MOL interconnect structures having ruthenium structures 200A-200D exhibit less resistance than conventional MOL interconnect structures and facilitate improved electrical current flow. As a result, parasitic capacitance, parasitic resistance, and associated RC delay of IC device 100 is greatly reduced by the disclosed MOL interconnect structures, which include ruthenium structures 200A-200D surrounded by air gaps 230.

Figure 16:
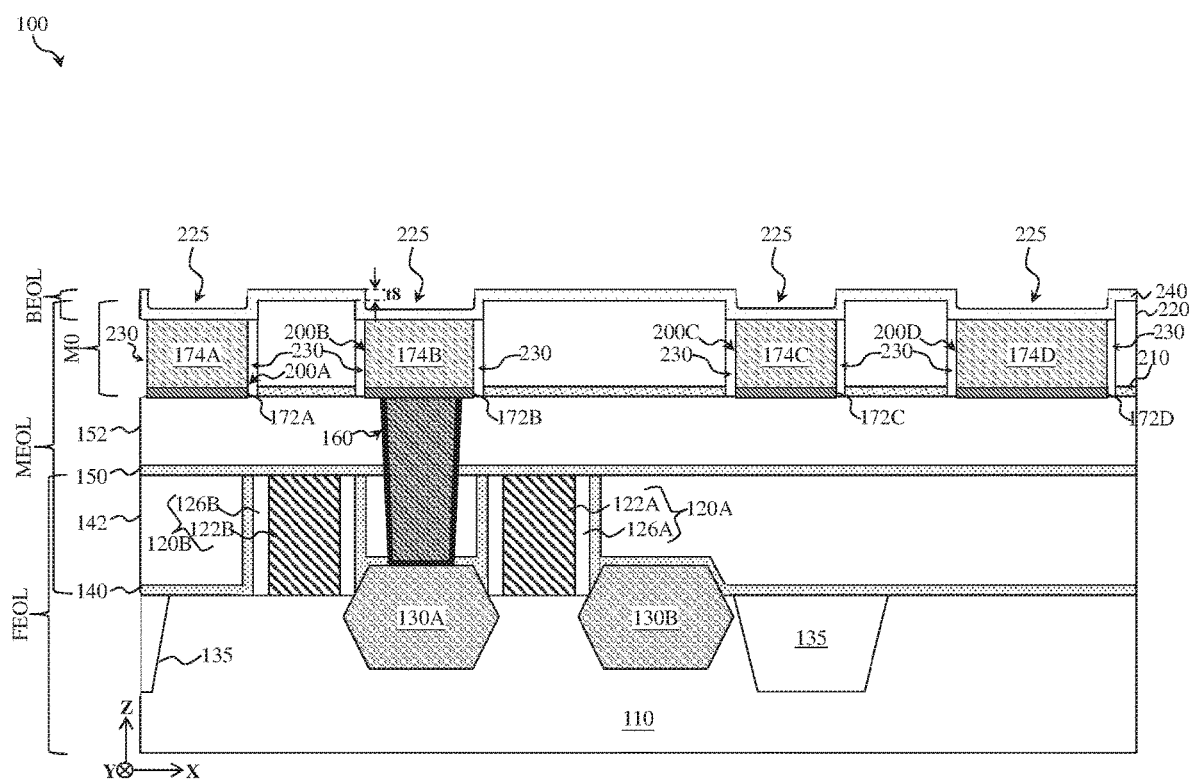
Figure 17:
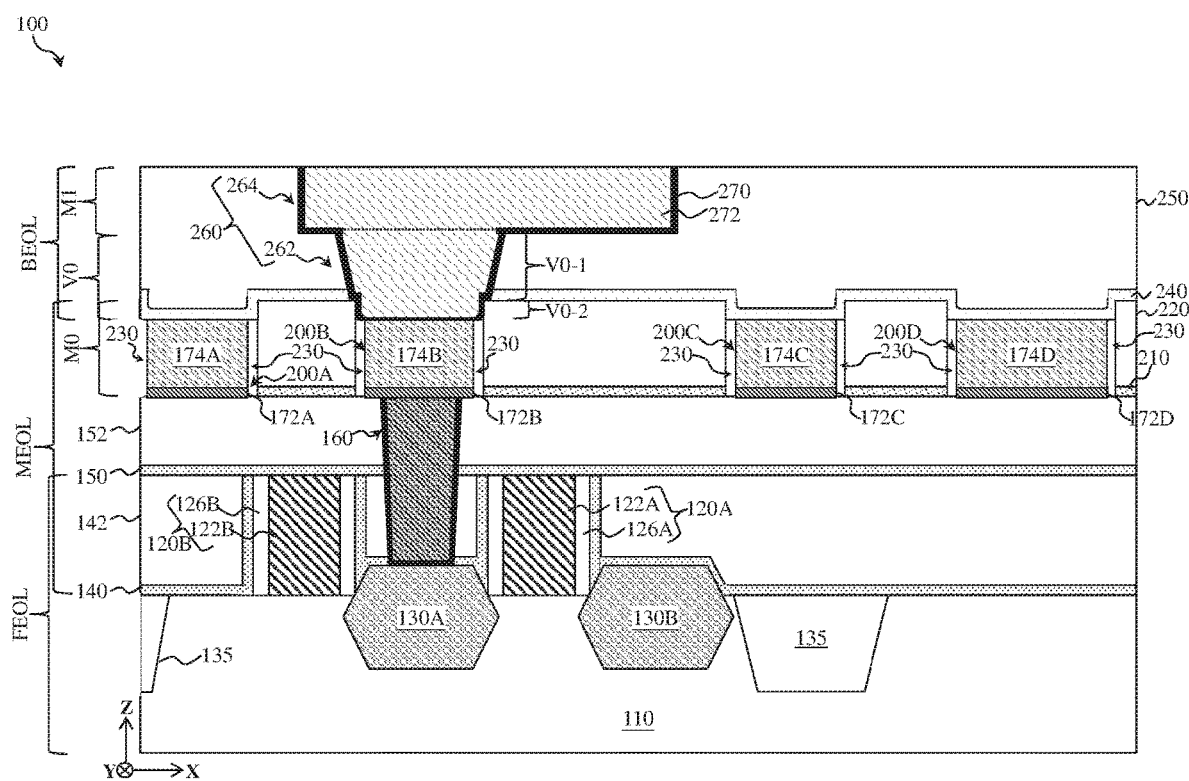

Turning to FIG. 16 and FIG. 17, BEOL processing begins with forming the first metallization layer (i.e., the V0 layer and the M1 layer) of the MLI feature. In FIG. 16, a CESL 240 is formed over the local contact layer (or M0 layer) (e.g., ILD layer 220, ruthenium structures 200A-200D, and air gaps 230) by a suitable deposition process, such as CVD, PVD, ALD, HDPCVD, MOCVD, RPCVD, PECVD, LPCVD, ALCVD, APCVD, PEALD, electroplating, electroless plating, other suitable deposition methods, or combinations thereof. A thickness t8 of CESL 240 is less than depth of recesses 225, such that thickness t8 is less than distance d greater. In some embodiments, thickness t8 is about 1 nm to about 15 nm. CESL 240 includes a material that is different than a material of ruthenium plugs 174A-174D and a subsequently formed ILD layer to achieve etching selectivity during subsequent etching processes, such as those used to form one or more via openings that expose one or more of ruthenium structures 200A-200D. In other words, CESL 240 and its surrounding layers will include materials having distinct etching sensitivities to a given etchant. For example, CESL 240 includes a material having an etch rate to an etchant that is different than an etch rate of a material of an ILD layer to the etchant so that the material of CESL 240 acts as an etch stop during etching of an overlying ILD layer (including, for example, a low-k dielectric material). In some embodiments, CESL 240 includes metal and oxygen, and thus may be referred to as a metal oxide CESL. The metal can include aluminum, hafnium, titanium, copper, manganese, vanadium, other suitable metal, or combinations thereof. In the depicted embodiment, the metal is aluminum, and CESL 240 is an aluminum oxide ($AlO_x$) CESL.

In FIG. 17, an ILD layer 250 is formed over CESL 240. ILD layer 250 fills a remainder of recesses 225, such that a portion of ILD layer 250 extends below a top surface of ILD layer 220. ILD layer 250 includes a dielectric material including, for example, silicon oxide, carbon doped silicon oxide, silicon nitride, silicon oxynitride, TEOS, PSG, BSG, BPSG, FSG, Black Diamond® (Applied Materials of Santa Clara, Calif.), xerogel, aerogel, amorphous fluorinated carbon, parylene, BCB-based dielectric material, SiLK (Dow Chemical, Midland, Mich.), polyimide, other suitable dielectric material, or combinations thereof. In some embodiments, ILD layer 250 includes a low-k dielectric material. In some embodiments, ILD layer 250 includes an ELK dielectric material, such as porous silicon dioxide material, silicon carbide material, and/or carbon-doped oxide (for example, a SiCOH-based material (having, for example, Si—$CH_3$ bonds)), each of which is tuned/configured to exhibit a dielectric constant less than about 2.5. In the depicted embodiment, ILD layer 250 includes silicon and oxygen (for example, SiCOH, $SiO_x$, or other silicon-and-oxygen comprising material) (and can thus be referred to as a silicon oxide layer or an oxide layer). In some embodiments, ILD layer 250 can include a multilayer structure having multiple dielectric materials. ILD layer 250 is formed by a deposition process, such as CVD, FCVD, HARP, HDP, PVD, ALD, HDPCVD, MOCVD, RPCVD, PECVD, LPCVD, ALCVD, APCVD, PEALD, other suitable methods, or combinations thereof. A CMP process and/or other planarization process can be performed after the deposition of ILD layer 250, such that ILD layer 250 has a substantially planar surface.

BEOL interconnect structures are then formed in ILD layer 250 and CESL 240 (which can collectively be referred to as an insulator layer), where each of the BEOL interconnect structures is physically connected to a respective local contact of the local contact layer. In the depicted embodiment, a BEOL interconnect structure 260 extends through ILD layer 250 and CESL 240 to physically contact ruthenium structure 200B. BEOL interconnect structure 260 includes a via 262 and a metal line 264, where via 262 physically and electrically connects ruthenium structure 200B to metal line 264. Via 262 has a first via portion V0-1 disposed over a second via portion V0-2. First via portion V0-1 is defined between metal line 264 and a top surface of ILD layer 220 and extends through a portion of ILD layer 250 and CESL 240. Second via portion V0-2 is defined between the top surface of ILD layer 220 and a top surface of ruthenium plug 174B and extends through a portion of ILD layer 220 to ruthenium plug 174B. In such configuration, via 262 physically contacts the top surface of ILD layer 220 (e.g., first via portion V0-1 is disposed directly on the top surface of ILD layer 220) and sidewalls of ILD layer 220 (e.g., second via portion V0-2 is disposed directly on a first sidewall of ILD layer 220 and a second sidewall of ILD layer 220 and second via portion V0-2 extends from the first sidewall to the second sidewall). A first width of first via portion V0-1 is greater than a second width of second via portion V0-2, and the second width of second via portion V0-2 is greater than a width of ruthenium plug 174B, such that second via portion V0-2 seals air gap 230 surrounding ruthenium plug 174B. In some embodiments, the second width of second via portion V0-2 is about equal to a sum of a width of ruthenium plug 174B and a width of air gap 230 times two (i.e., second width of second via portion V0-2=width of ruthenium plug 174B+(2× width of air gap 230)). In the depicted embodiment, air gaps 230 thus have lengths defined along the z-direction between via 262 and ILD layer 152 (in particular, between a bottom surface of via 262 and a top surface of ILD layer 152).

BEOL interconnect structure 260 includes a contact barrier layer 270 and a contact plug 272 that is disposed over contact barrier layer 270, where via 262 and metal line 264 each include a portion of contact barrier layer 270 and a portion of contact plug 272. Contact barrier layer 270 includes a material that promotes adhesion between a surrounding dielectric material (here, ILD layer 220, CESL 240, and/or ILD layer 250) and contact plug 272. The material of contact barrier layer 270 may further prevent diffusion of metal constituents from BEOL interconnect structure 260 into the surrounding dielectric material. In some embodiments, contact barrier layer 270 includes titanium, titanium alloy, tantalum, tantalum alloy, cobalt, cobalt alloy, ruthenium, ruthenium alloy, molybdenum, molybdenum alloy, palladium, palladium alloy, other suitable constituent configured to promote and/or enhance adhesion between a metal material and a dielectric material and/or prevent diffusion of metal constituents from the metal material to the dielectric material, or combinations thereof. For example, contact barrier layer 270 includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, contact barrier layer 270 includes multiple layers. For example, contact barrier layer 270 may include a first sub-layer that includes titanium and a second sub-layer that includes titanium nitride. In another example, contact barrier layer 270 may include a first sub-layer that includes tantalum and a second sub-layer that includes tantalum nitride. Contact plug 272 includes tungsten, ruthenium, cobalt, copper, aluminum, iridium, palladium, platinum, nickel, low resistivity metal constituent, alloys thereof, or combinations thereof. In the depicted embodiment, contact plug 272 includes a material different than ruthenium plugs 174A-174D. For example, contact plug 272 includes tungsten, cobalt, and/or copper. In some embodiments, BEOL interconnect structure 260 does not include contact barrier layer 270 (i.e., BEOL interconnect structure 260 is barrier-free), such that contact plug layer 272 physically contacts ILD layer 220, CESL 240, and/or ILD layer 250. In some embodiments, BEOL interconnect structure 260 is partially barrier-free, where contact barrier layer 270 is disposed between only a portion of contact plug 272 and the dielectric layer. In some embodiments, contact plug 272 includes multiple layers.

BEOL interconnect structure 260 can be formed by a dual damascene process, which involves depositing conductive material for via 262 and metal line 264 at the same time. In such embodiments, via 262 and metal line 264 share contact barrier layer 270 and contact plug 272, instead of each having a respective and distinct contact barrier layer and contact plug (e.g., where a contact barrier layer of metal line 264 would separate a metal plug of metal line 264 from a via plug of via 262). In some embodiments, the dual damascene process includes performing a patterning process to form an interconnect opening that extends through ILD layer 250 and CESL 240 to expose ruthenium structure 200B and air gap 230 surrounding ruthenium structure 200B. The patterning process can include a first lithography step and a first etch step to form a trench opening of the interconnect opening (which corresponds with and defines metal line 264) in ILD layer 250, a second lithography step and a second etch step to form a via opening of the interconnect opening (which corresponds with and defines via 262) in ILD layer 250 that exposes a portion of CESL 240, and a third etch step to remove the exposed portion of CESL 240, thereby exposing ruthenium structure 200B, air gap 230 surrounding ruthenium structure 200B, and a portion of a top surface of ILD layer 220. The first lithography/first etch step and the second lithography/second etch step can be performed in any order (e.g., trench first via last or via first trench last). The first etch step and the second etch step are each configured to selectively remove ILD layer 250 with respect to a patterned mask layer and CESL 240, while the third etch step is configured to selectively remove CESL 240 with respect to ILD layer 250, ILD layer 220, and ruthenium plug 174B. In other words, the first etch step and the second etch step substantially remove ILD layer 250 but do not remove, or do not substantially remove, CESL 240, while the third etch step substantially removes CESL 240 but does not remove, or does not substantially remove ILD layer 250, ILD layer 220, and ruthenium plug 174B. The first etch step, the second etch step, and the third etch step can implement a dry etching process, a wet etching process, or combinations thereof. In some embodiments, the first etch step and the second etch step are dry etching processes and the third etch step is a wet etching process. It is noted that, because the top surface of ruthenium structure 200B is lower than a top surface of ILD layer 220, the via opening of the interconnect opening is self-aligned with ruthenium structure 200B, minimizing (and, in some embodiments, eliminating) any via landing issues that may arise from overlay shift of interconnect opening (e.g., where the interconnect opening is undesirably and unintentionally shifted left or right from a target position for exposing ruthenium structure 200B). For example, in a conventional interconnect processing embodiment, top surfaces of ruthenium structures 200A-200D would be substantially planar with the top surface of ILD layer 220. In such embodiment, when forming via 262, overlay shift may result in the via opening of the interconnect opening being shifted to the left, either unintentionally exposing ruthenium structure 200A (which may result in an electrical short) or resulting in a lateral spacing (e.g., along the x-direction) between via 262 and ruthenium structure 200A that increases parasitic resistance therebetween. Such lateral spacing may be referred to as metal-via leak spacing. In contrast, in the disclosed embodiments, even if overlay shift causes the interconnect opening to shift left relative to ruthenium structure 200B, a bottom of via 262 (i.e., second via portion V0-2) is self-aligned with and confined to an area corresponding with ruthenium structure 200B, maintaining desired metal-via leak spacing, and a top of via 262 (i.e., first via portion V0-1) is separated from the local contact layer by ILD layer 220, minimizing risks of electrical shorting. This self-aligned via bottom approach further contributes to the disclose MOL interconnect structure exhibiting improved resistance and capacitance characteristics compared to conventional MOL interconnect structures.

After performing the patterning process, the dual damascene process includes performing a first deposition process to form a contact barrier material over ILD layer 250 that partially fills the interconnect opening and performing a second deposition process to form a contact bulk material over the contact barrier material, where the contact bulk material fills a remainder of the interconnect opening. In such embodiments, the contact barrier material and the contact bulk material are disposed in the interconnect opening and over a top surface of ILD layer 250. The first deposition process and the second deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. In some embodiments, contact barrier layer 270 has a substantially uniform thickness along sidewalls and bottom of the interconnect opening. Contact barrier layer 270 may thus be formed by a conformal deposition process. A CMP process and/or other planarization process is then performed to remove excess contact bulk material and contact barrier material, for example, from over the top surface of ILD layer 250, resulting in BEOL interconnect structure 260 (in other words, contact barrier layer 270 and contact plug 272 filling the interconnect opening). The CMP process planarizes a top surface of BEOL interconnect structure 260 and ILD layer 250, such that in some embodiments, a top surface of ILD layer 250 and a top surface of metal line 264 form a substantially planar surface. The contact barrier material and the contact bulk material fill the trench opening and the via opening of the interconnect opening without interruption, such that contact barrier layer 270 and contact plug 272 each extend continuously from metal line 264 to via 262 without interruption.

Figure 18:
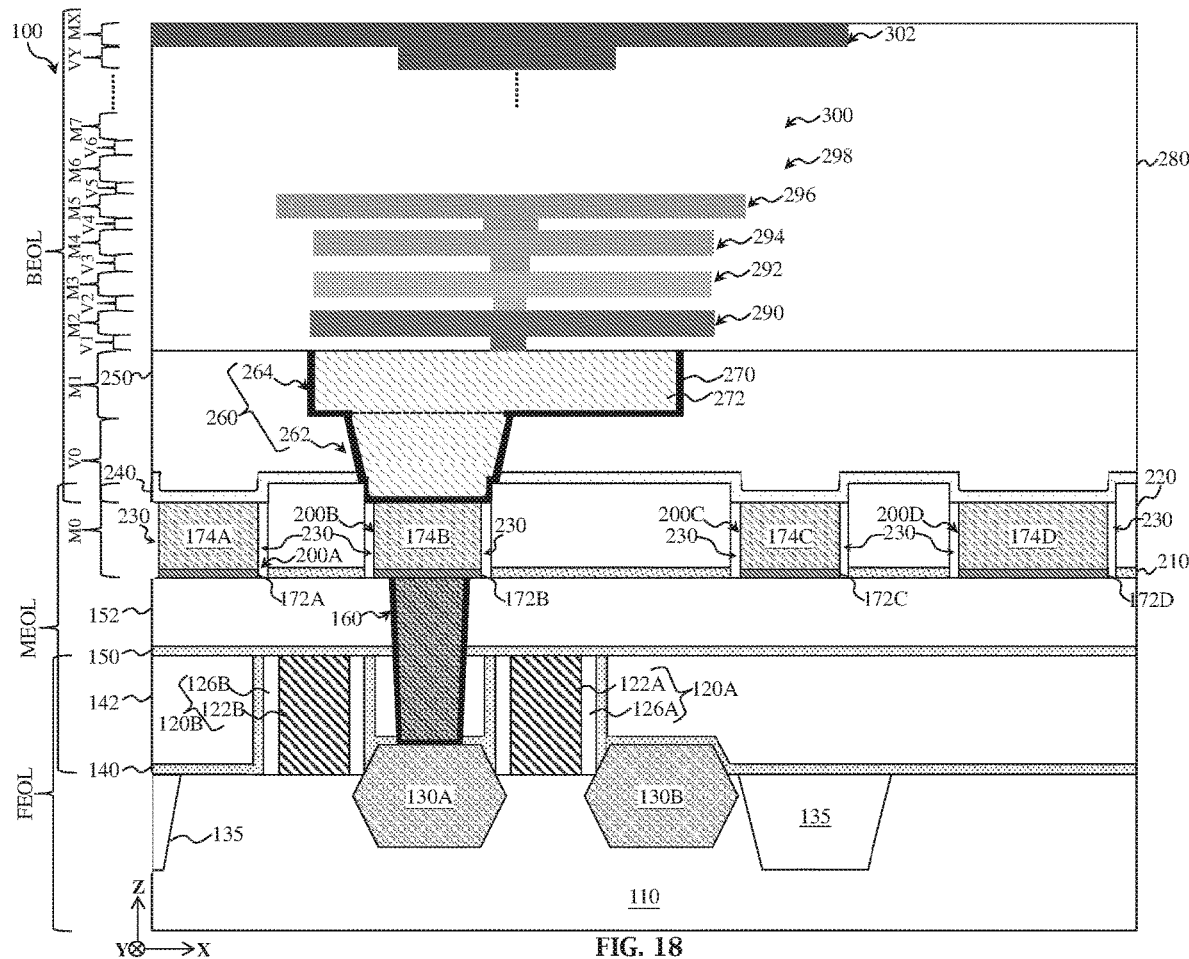

Turning to FIG. 18, BEOL processing continues with forming additional metallization layers (levels) of the MLI feature over the first metallization layer. For example, BEOL processing includes forming a second metallization layer (i.e., a metal two (M2) layer and a via one (V1) layer), a third metallization layer (i.e., a metal three (M3) layer and a via two (V2) layer), a fourth metallization layer (i.e., a metal four (M4) layer and a via three (V3) layer), a fifth metallization layer (i.e., a metal five (M5) layer and a via four (V4) layer), a sixth metallization layer (i.e., a metal six (M6) layer and a via five (V5) layer, a seventh metallization layer (i.e., a metal seven (M7) layer and a via six (V6) layer)) to a topmost metallization layer (i.e., a metal X (MX) layer and a via Y (VY) layer, where X is a total number of patterned metal line layers of the MLI feature and Y is a total number of patterned via layers of the MLI feature) over the first metallization layer. Each of the metallization layers includes a patterned metal line layer and a patterned via layer configured to provide at least one BEOL interconnect structure disposed in an insulator layer 280, which includes at least one ILD layer and at least one CESL similar to the ILD layers and the CESLs described herein. For example, the second metallization layer includes a BEOL interconnect structure 290 (having a V1 via and a M2 metal line, where the V1 via connects the M2 metal line to metal line 264), the third metallization layer includes a BEOL interconnect structure 292 (having a V2 via and a M3 metal line, where the V2 via connects the M2 metal line to the M3 metal line), the fourth metallization layer includes a BEOL interconnect structure 294 (having a V3 via and a M4 metal line, where the V3 via connects the M3 metal line to the M4 metal line), the fifth metallization layer includes a BEOL interconnect structure 296 (having a V4 via and a M5 metal line, where the V4 via connects the M4 metal line to the M5 metal line), the sixth metallization layer includes a BEOL interconnect structure 298 (having a V5 via and a M6 metal line, where the V5 via connects the M5 metal line to the M6 metal line), the seventh metallization layer includes a BEOL interconnect structure 300 (having a V6 via and a M7 metal line, where the V6 via connects the M6 metal line to the M7 metal line), and the topmost metallization layer includes a BEOL interconnect structure 302 (having a VY via and a MX metal line, where the VY via connects an M(X-1) metal line to the MX metal line). BEOL interconnect structures 290-302 are formed by any suitable process, including by various dual damascene processes as described herein, and include any suitable materials and/or layers. It is noted that though the MLI feature of IC device 100 is depicted with a given number of metallization layers disposed within a given number of dielectric layers, the present disclosure contemplates the MLI feature having more or less metal layers, via layers, and/or dielectric layers depending on design requirements of IC device 100. In some embodiments, the MLI feature has seven to fourteen metallization layers (e.g., M6 to M14 and V6 to V13).

FIGS. 19-27 are fragmentary diagrammatic views of an IC device 400, in portion or entirety, at various stages of fabricating a MOL interconnect of IC device 400 (such as those associated with method 10 in FIG. 1), according to another embodiment of the present disclosure. IC device 400 is similar in many respects to IC device 100 and is fabricated in a similar manner as IC device 100, such as in the manner described in FIGS. 2-18. Accordingly, similar features in FIGS. 2-18 and FIGS. 19-27 are identified by the same reference numerals for clarity and simplicity. IC device 400 may be included in a microprocessor, a memory, and/or other IC device. In some embodiments, IC device 400 is a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. The various transistors may be planar transistors or non-planar transistors, such as FinFETs or GAA transistors. FIGS. 19-27 have been simplified for the sake of clarity to better understand the inventive concepts of the present disclosure. Additional features can be added in IC device 400, and some of the features described below can be replaced, modified, or eliminated in other embodiments of IC device 400.

Figure 19:
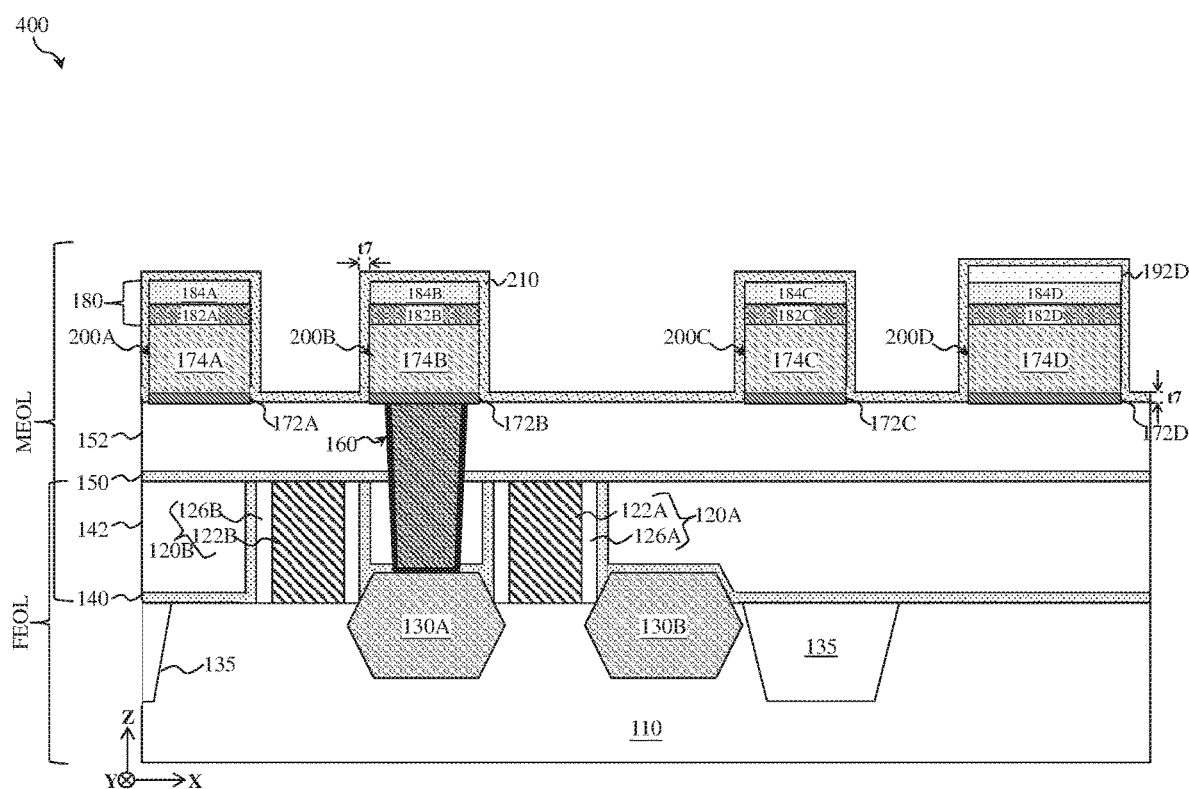
FIGS. 19-27 are fragmentary diagrammatic views of an integrated circuit device, in portion or entirety, at various stages of fabricating a middle-of-line interconnect structure, such as the method for fabricating a middle-of-line interconnect structure of an integrated circuit device of FIG. 1, according to various aspects of the present disclosure.
Figure 20:
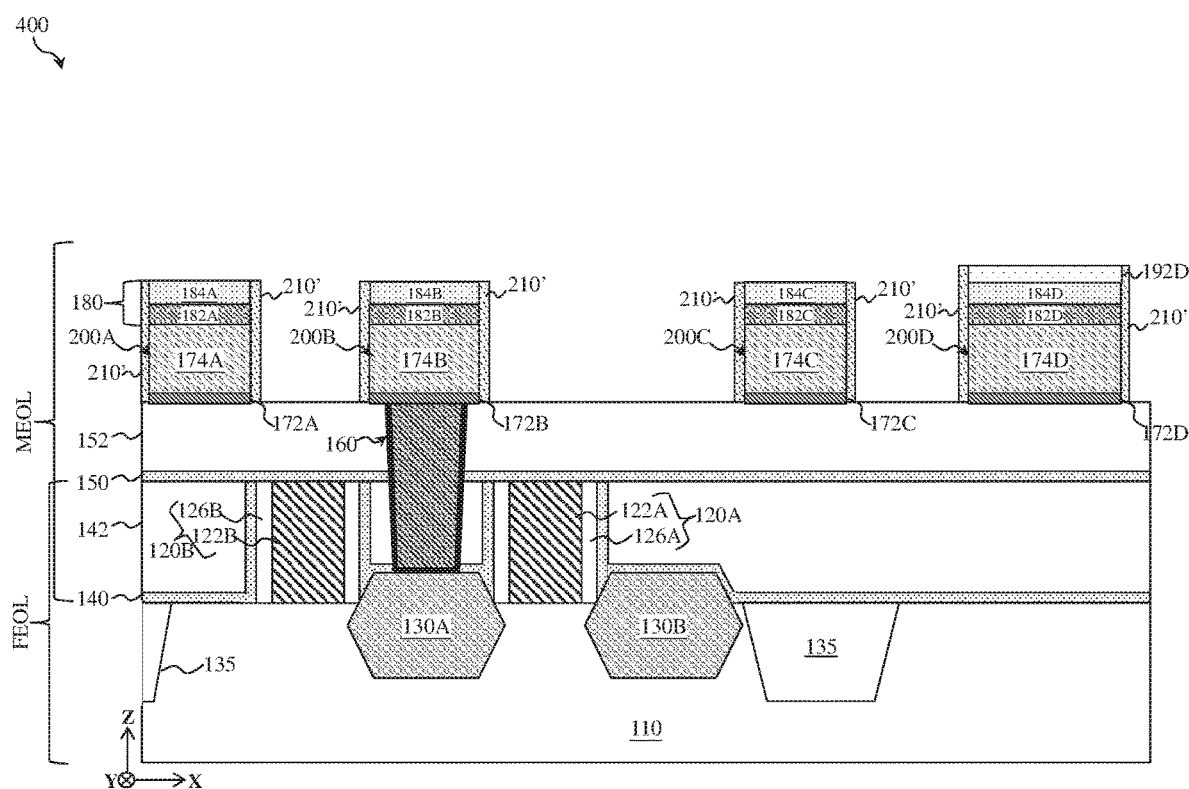

Turning to FIG. 19, IC device 400 has undergone processing described with reference to FIGS. 2-11, such that dummy contact spacer layer 210 (also referred to as a spacer layer) is formed over ruthenium structures 200A-200D and remainder of mask layer 180 (e.g., oxide feature 192D, dielectric-comprising mask features 184A-184D, and/or metal-comprising mask features 182A-182D). Turning to FIG. 20, in contrast to the processing described with reference to FIGS. 12-18, before forming ILD layer 220, dummy contact spacers 210' are formed along sidewalls of ruthenium structures 200A-200D and the remainder of mask layer 180. For example, portions of dummy contact spacer layer 210 that are disposed over the top surface of ILD layer 152 and over the top surface of the remainder of mask layer 180 are removed by any suitable process. In some embodiments, an etching process is configured to remove dummy contact spacer layer 210 disposed over horizontally-oriented surfaces (e.g., extending substantially along the X-Y plane) surfaces but not, or minimally, removing dummy contact spacer layer 210 from vertically-oriented surfaces (e.g., extending substantially along the X-Z plane and/or the Y-Z plane). In some embodiments, the etching process is a dry etching process, which may be configured to generate a plasma from any of the etch gases disclosed herein, such that the dry etch uses plasma-excited species for removing dummy spacer layer 210 from over ILD layer 250, but not from sidewalls of ruthenium structures 200A-200D.

Figure 21:
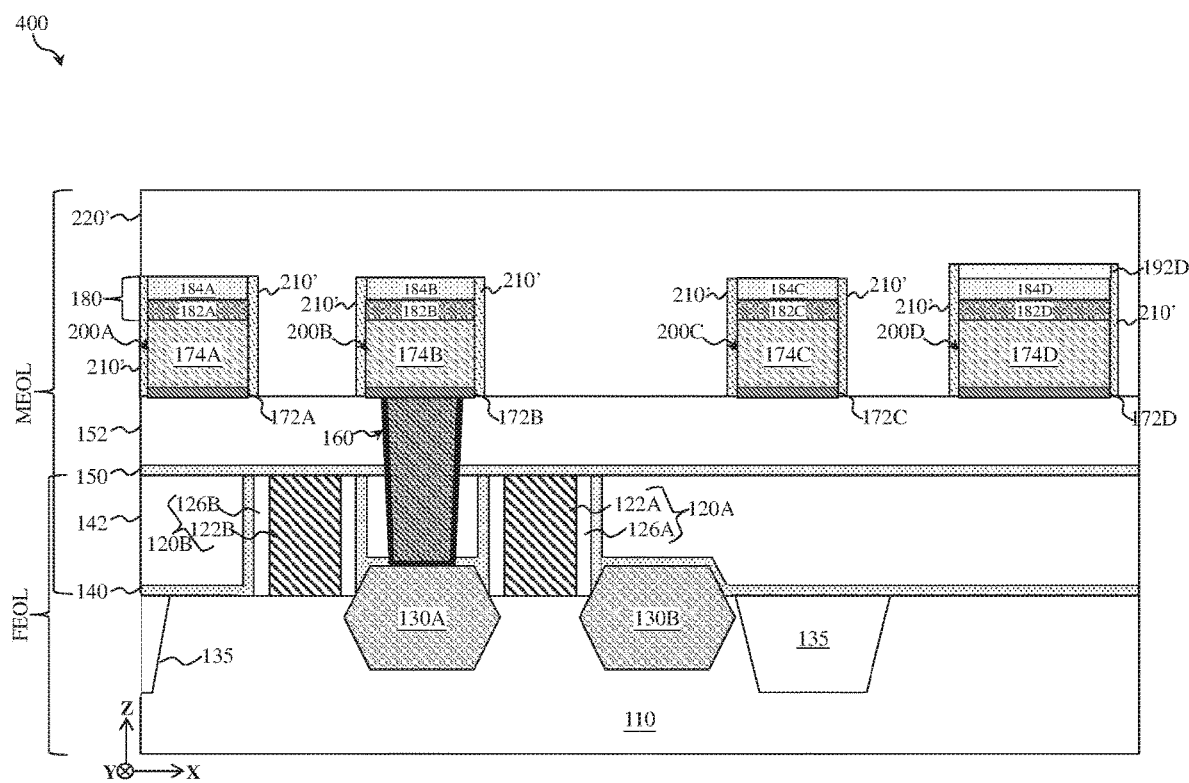
Figure 22:
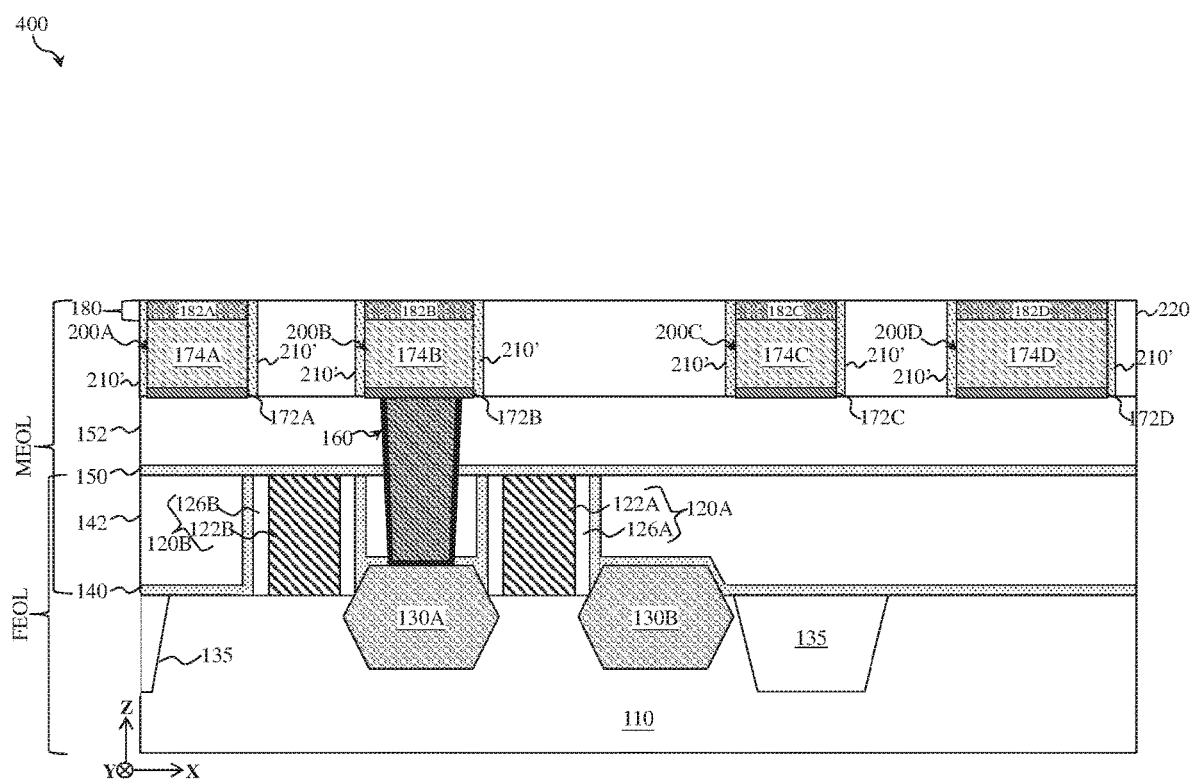
Figure 23:
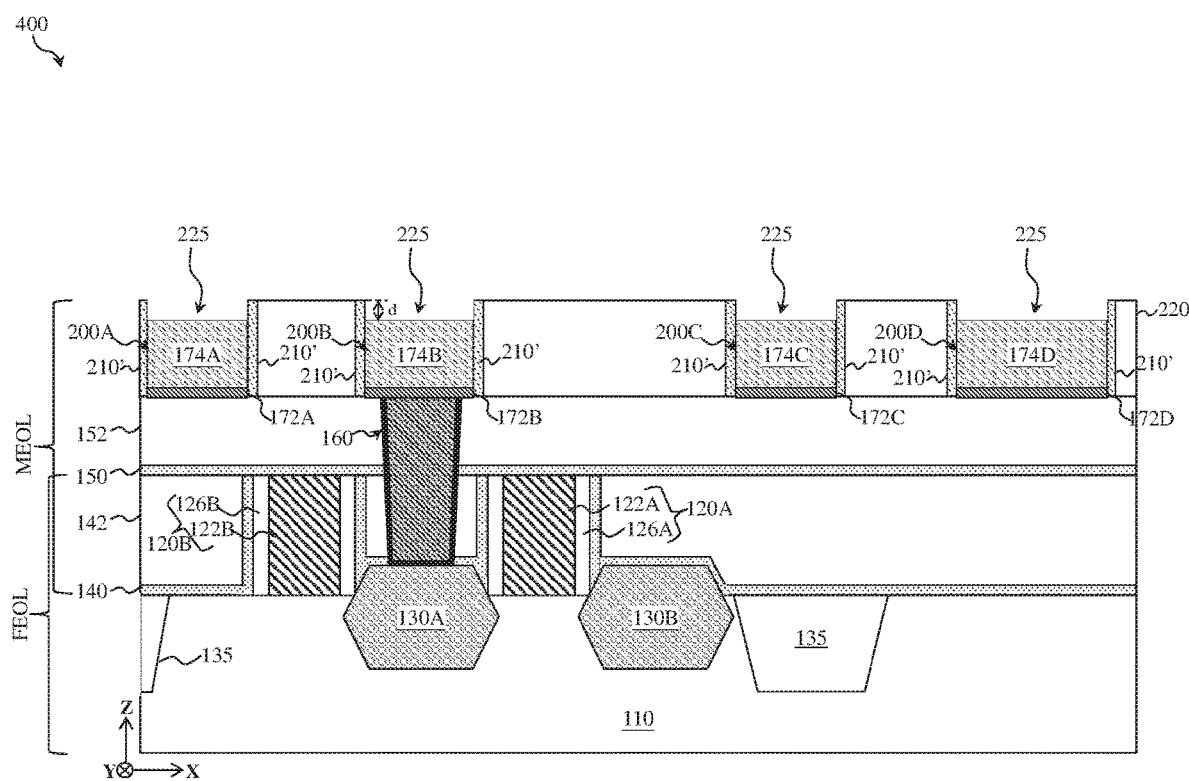
Figure 24:
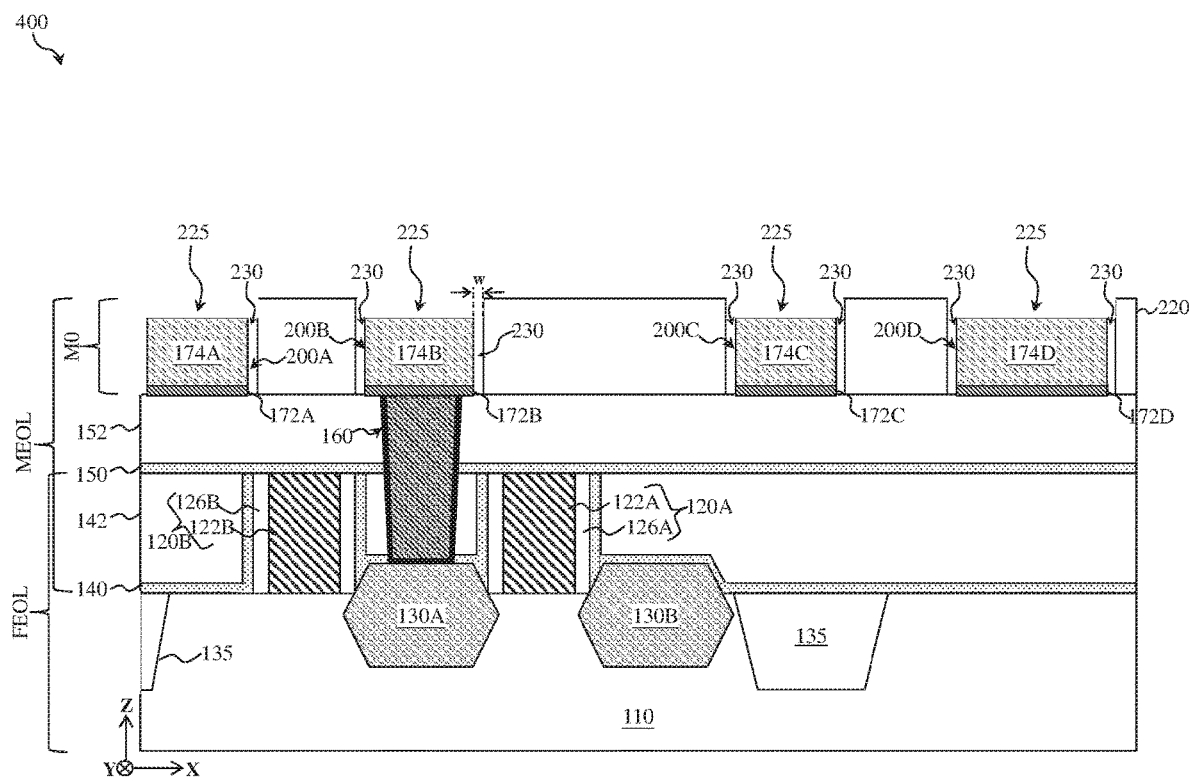
Figure 25:
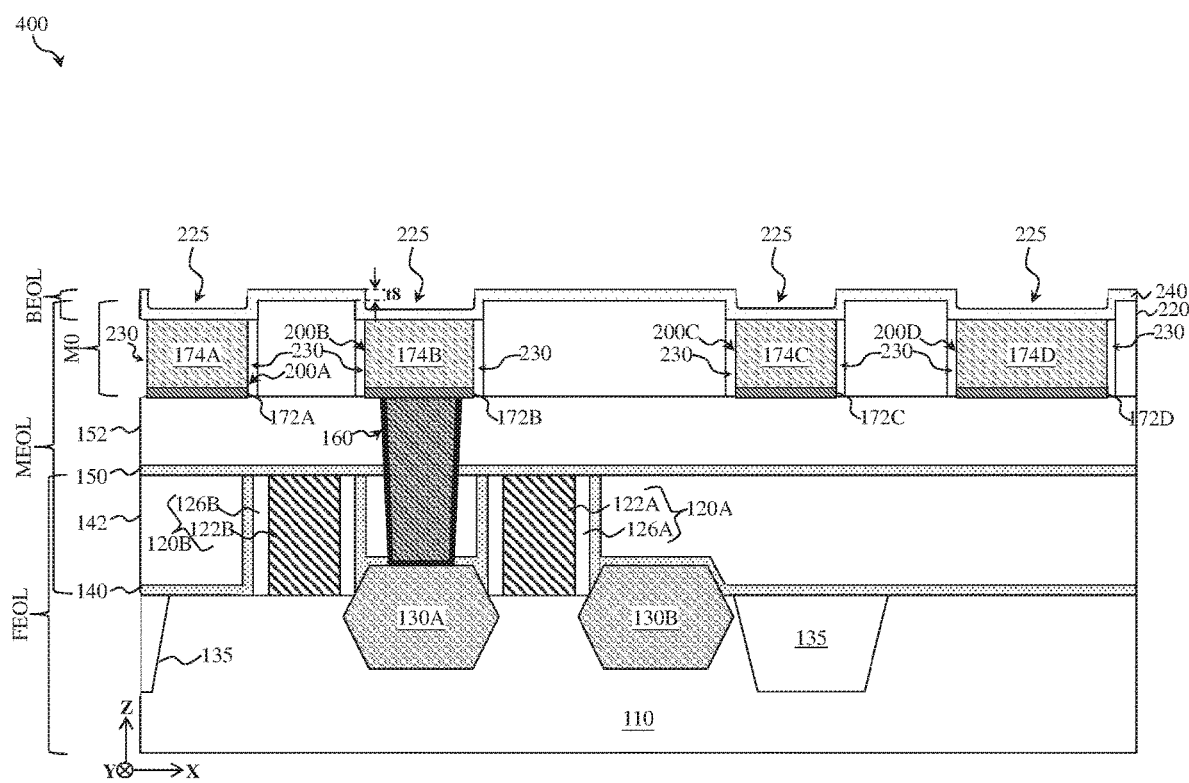
Figure 26:
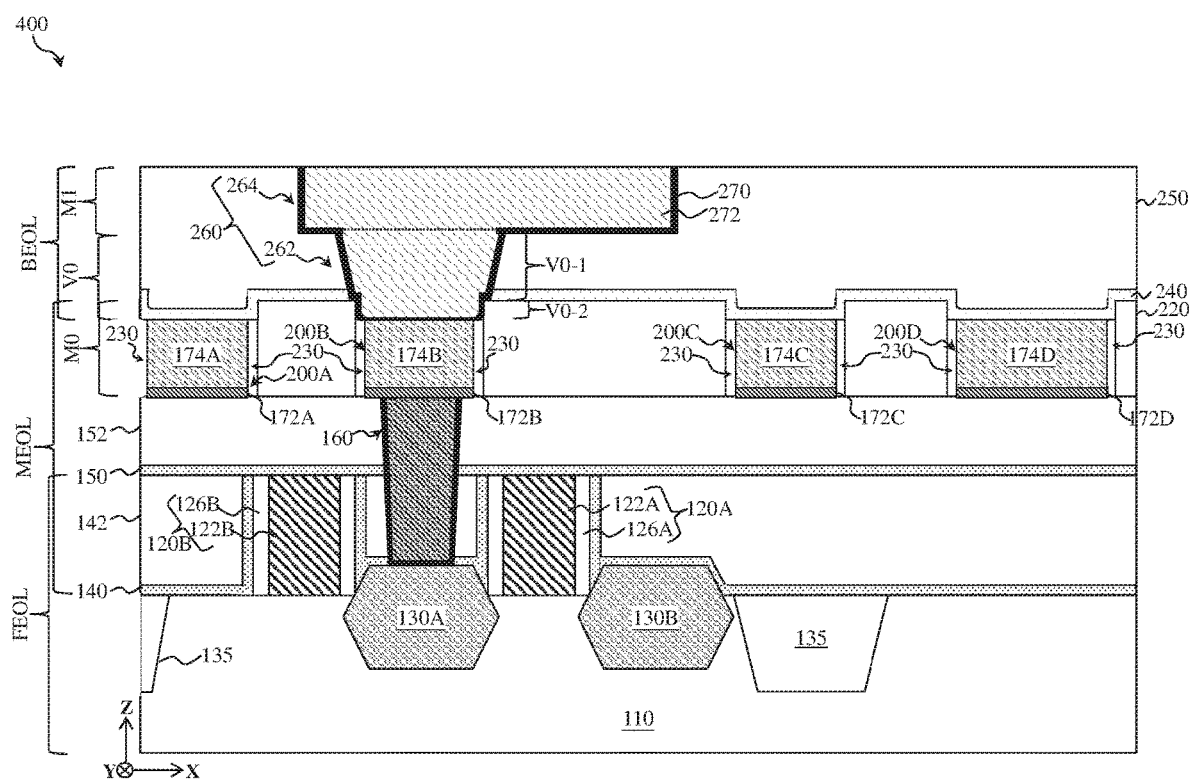
Figure 27:
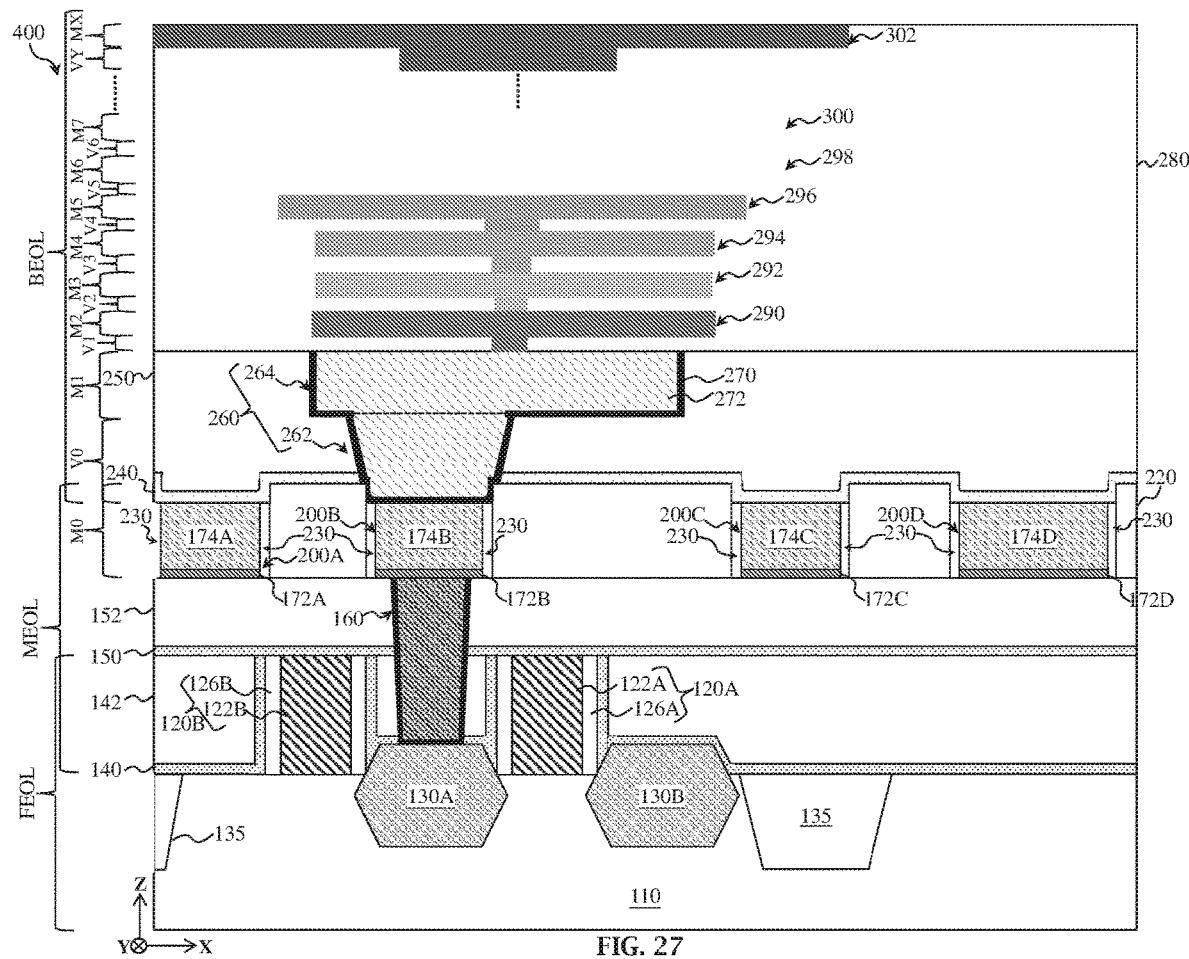

Turning to FIG. 21 and FIG. 22, dielectric material 220' is then formed and processed to form ILD layer 220 over dummy contact spacers 210', the top surface of the remainder of mask layer 180, and the top surface of ILD layer 152, such as described with reference to FIG. 12 and FIG. 13 above. Because dummy contact spacer layer 210 is removed from over the top surface of ILD layer 152, ILD layer 220 is disposed directly on and physically contacts ILD layer 152. In FIG. 22, a thickness of ILD layer 220 is thus about equal to a sum of a thickness of ruthenium structures 200A-200D (e.g., a sum of thickness t1 and thickness t2) and a thickness of the remainder of mask layer 180 (e.g., thickness t3). It is further noted that, because ruthenium structures 200A-200D are formed by depositing contact layers and then etching the contact layers (instead of forming contact openings within a dielectric layer and depositing the contact layers in the contact opening), IC device 100 further does not include an etch stop layer between ILD layer 152 and ILD layer 220. Turning to FIG. 23, patterned metal-comprising mask layer 182' (i.e., metal-comprising mask features 182A-182D) is removed from over ruthenium structures 200A-200D, thereby forming recesses (trenches) 225, as described above with reference to FIG. 14. In FIG. 23, recesses 225 have sidewalls defined by dummy contact spacers 210'. In such embodiments, an etching process is configured to selectively remove patterned metal-comprising mask layer 182' with respect to ruthenium structures 200A-200D, dummy contact spacers 210', and ILD layer 220. Turning to FIG. 24, an etching process is performed to selectively remove dummy contact spacers 210' and form air gaps 230 for ruthenium structures 200A-200D. The etching process is configured to selectively remove dummy contact spacers 210s with respect to ILD layer 220 and ruthenium structures 200A-200D, such as described above with reference to FIG. 15. In FIG. 24, air gaps 230 have bottoms defined by ILD layer 152, first sidewalls defined entirely by ILD layer 220, and second sidewalls defined by ruthenium structures 200A-200D. Accordingly, air gaps 230 are disposed along sidewalls of ruthenium structures 200A-200D and extend through ILD layer 220 to ILD layer 152, such that air gaps 230 surround ruthenium structures 200A-200D. Turning to FIGS. 25-27, BEOL processing then forms various metallization layers over the local contact layer as described above with reference to FIGS. 16-18.

The various etching processes performed in FIGS. 2-27 include dry etching processes, wet etching processes, or combinations thereof. The dry etching processes may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. The dry etching processes can use a carrier gas to deliver the etch gas. The carrier gas can include nitrogen, argon, helium, xenon, other suitable carrier gas constituent, or combinations thereof. The wet etching processes may implement a wet etchant solution that includes $H_2SO_4$, $H_2O_2$, $NH_4OH$, HCl, HF, DHF, KOH, $NH_3$, $CH_3COOH$, $HNO_3$, $H_3PO_4$, $H_2O$ (which can be DIW or $DIWO_3$), $O_3$, other suitable chemicals, or combinations thereof. During each etching process, various etch parameters can be tuned to achieve desired selective etching, such as a flow rate of an etch gas, a concentration of the etch gas, a concentration of the carrier gas, a ratio of a concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof.

The present disclosure provides for many different embodiments. MOL interconnects that facilitate reduced capacitance and/or resistance and corresponding techniques for forming the MOL interconnects are disclosed herein. An exemplary MOL interconnect structure includes a device-level contact disposed in a first insulator layer and a ruthenium structure disposed in a second insulator layer disposed over the first insulator layer. The device-level contact physically contacts an integrated circuit feature, and the ruthenium structure physically contacts the device-level contact. An air gap separates sidewalls of the ruthenium structure from the second insulator layer. A top surface of the ruthenium structure is lower than a top surface of the second insulator layer. A via disposed in a third insulator layer and extends below the top surface of the second insulator layer to physically contact the ruthenium structure. In some embodiments, a remainder of a dummy contact spacer layer is disposed between and separates the first insulator layer and the second insulator layer. In some embodiments, the dummy contact spacer layer is an amorphous silicon layer, a titanium oxide layer, or an amorphous carbon layer. In some embodiments, the ruthenium structure includes an adhesion layer and a ruthenium plug disposed over the adhesion layer, and the air gap separates sidewalls of the ruthenium plug from the second insulator layer. In some embodiments, the air gap further separates sidewalls of the adhesion layer from the second insulator layer. In some embodiments, the device further includes a back-end-of-line interconnect structure disposed over the middle-of-line interconnect structure. The back-end-of-line interconnect structure has the via disposed in the third insulator layer and a metal line disposed in the third insulator layer. The third insulator layer is disposed over the second insulator layer and the metal line physically contacts the via. In some embodiments, the air gap has a length defined between a bottom surface of the via and a top surface of the first insulator layer. In some embodiments, the first insulator layer includes an etch stop layer and the second insulator layer is free of an etch stop layer.

Another exemplary device includes a first oxide layer disposed over a substrate, a second oxide layer disposed over the first oxide layer, and a third oxide layer disposed over the second oxide layer. A device-level contact is disposed in and extending through the first oxide layer and physically contacts an IC device feature formed on the substrate. A ruthenium structure is disposed in the second oxide layer and physically contacts the ruthenium structure. An air gap is disposed between sidewalls of the ruthenium structure and the second oxide layer. A via is disposed in the third oxide layer and the second oxide layer, wherein the via physically contacts the ruthenium structure. In some embodiments, the second oxide layer is disposed directly on and physically contacts the first oxide layer and a metal oxide layer is disposed between and separates the second oxide layer from the third oxide layer. In some embodiments, a remainder of a dummy contact spacer layer is disposed between and separates the second oxide layer and the first oxide layer, and a metal oxide layer is disposed between and separates the second oxide layer from the third oxide layer. In some embodiments, the via includes a first via portion disposed in the third oxide layer and a second via portion disposed in the second oxide layer, wherein a first width of the first via portion is greater than a second width of the second via portion and a third width of the ruthenium structure is less than the second width. In some embodiments, the via physically contacts a top surface of the second oxide layer and a sidewall of the second oxide layer. In some embodiments, the device includes a fourth oxide layer disposed between the substrate and the first oxide layer, where the device-level contact is further disposed in the fourth oxide layer. The device further includes a first etch stop layer and a second etch stop layer. The first etch stop layer is disposed between the third oxide layer and the second oxide layer. The second etch stop layer is disposed between the fourth oxide layer and the first oxide layer.

An exemplary method includes forming a contact adhesion layer over a device-level contact layer, forming a ruthenium layer over the contact adhesion layer, forming a patterned mask feature over the ruthenium layer, and forming a ruthenium structure by etching the ruthenium layer and the contact adhesion layer using the patterned mask feature as an etch mask. The ruthenium structure physically contacts a device-level contact of the device-level contact layer. The method further includes forming a dummy contact spacer layer over the ruthenium structure and the device-level contact layer. The dummy contact spacer layer is disposed along sidewalls of the ruthenium structure. The method further includes forming an insulator layer over the dummy contact spacer layer, the ruthenium structure, and the device-level contact layer. The method further includes removing the dummy contact spacer layer from the sidewalls of the ruthenium structure to form an air gap between sidewalls of the ruthenium structure and the insulator layer. The method further includes forming a via that physically contacts the ruthenium structure. In some embodiments, the method further includes removing the patterned mask feature after forming the insulator layer and before removing the dummy contact spacer layer. In some embodiments, the method further includes, before forming the insulator layer, removing the dummy contact spacer layer from over the device-level contact layer. In some embodiments, the patterned mask feature is a first patterned mask feature, and the method further includes, before forming the first patterned mask feature over the ruthenium layer, forming a mask layer over the ruthenium layer, and etching the mask layer to form a second patterned mask feature when forming the ruthenium structure. In such embodiments, the forming the insulator layer can include using the second patterned mask feature as a planarization stop during a planarization process. In such embodiments, the method can further include removing the second patterned mask feature to form a recess defined between the ruthenium structure and the insulator layer, wherein the via fills the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a ruthenium structure over and physically contacting a device-level contact;
   forming a dummy contact spacer layer along sidewalls of the ruthenium structure;
   after forming an insulator layer over the dummy contact spacer layer, removing the dummy contact spacer layer from the sidewalls of the ruthenium structure to form an air gap between the sidewalls of the ruthenium structure and the insulator layer; and
   forming a via that physically contacts the ruthenium structure.

2. The method of claim 1, further comprising, before forming the insulator layer, removing the dummy contact spacer layer from over a device-level contact layer that includes the device-level contact disposed therein.

3. The method of claim 1, wherein the forming the ruthenium structure includes:
   forming a contact adhesion layer over a device-level contact layer that includes the device-level contact disposed therein;
   forming a ruthenium layer over the contact adhesion layer;
   forming a patterned mask feature over the ruthenium layer; and
   etching the ruthenium layer and the contact adhesion layer using the patterned mask feature as an etch mask.

4. The method of claim 3, further comprising removing the patterned mask feature after forming the insulator layer and before removing the dummy contact spacer layer.

5. The method of claim 3, wherein the patterned mask feature is a first patterned mask feature, the method further comprising:
   before forming the first patterned mask feature over the ruthenium layer, forming a mask layer over the ruthenium layer;
   etching the mask layer to form a second patterned mask feature when forming the ruthenium structure, wherein the forming the insulator layer includes using the first patterned mask feature as a planarization stop during a planarization process; and
   removing the second patterned mask feature to form a recess between the ruthenium structure and the insulator layer, wherein the via fills the recess.

6. The method of claim 1, wherein the forming the dummy contact spacer layer along sidewalls of the ruthenium structure includes depositing an amorphous silicon layer over the ruthenium structure.

7. The method of claim 1, wherein the forming the dummy contact spacer layer along sidewalls of the ruthenium structure includes depositing a titanium oxide layer over the ruthenium structure.

8. The method of claim 1, wherein the forming the dummy contact spacer layer along sidewalls of the ruthenium structure includes depositing an amorphous carbon layer over the ruthenium structure.

9. The method of claim 1, wherein the insulator layer is a first insulator layer and the forming the via that physically contacts the ruthenium structure includes:
after removing the dummy contact spacer layer, removing a mask layer to expose the ruthenium structure, wherein a top surface of the exposed ruthenium structure is a distance below a top surface of the insulator layer;
forming a metal oxide layer over the insulator layer and the top surface of the exposed ruthenium structure, wherein a thickness of the metal oxide layer is less than the distance;
forming a second insulator layer over the metal oxide layer;
patterning the second insulator layer and the metal oxide layer to form an opening therein that exposes the ruthenium structure and the air gap; and
filling the opening with a conductive material.

10. A method comprising:
forming a ruthenium layer over a first oxide layer having a source/drain contact therein;
forming a mask layer over the ruthenium layer;
patterning the mask layer and the ruthenium layer to form a mask feature over a ruthenium contact, respectively, wherein the ruthenium contact is on the source/drain contact;
forming a sacrificial layer over the mask feature, the ruthenium contact, and the first oxide layer, wherein a material of the sacrificial layer is different than a material of the ruthenium contact and a material of the first oxide layer;
forming a second oxide layer over the sacrificial layer;
after removing the mask feature, removing the sacrificial layer to form an air gap between sidewalls of the ruthenium contact and the second oxide layer;
forming an etch stop layer over the second oxide layer and the ruthenium contact;
forming a third oxide layer over the etch stop layer; and
forming a metal contact that extends through the third oxide layer, the etch stop layer, and the second oxide layer to the ruthenium contact.

11. The method of claim 10, further comprising removing the sacrificial layer from over the first oxide layer before forming the second oxide layer.

12. The method of claim 10, wherein:
the mask feature includes a first mask feature over a second mask feature;
the forming the second oxide layer includes performing a planarization process that removes the first mask feature and stops on the second mask feature; and
the removing the mask feature includes removing the second mask feature to form a recess that exposes a top surface of the ruthenium contact.

13. The method of claim 10, wherein the forming the metal contact includes performing a first lithography step and a first etch step to remove the third oxide layer, a second lithography step and a second etch step to remove the third oxide layer, and a third etch step to remove the etch stop layer, wherein the first etch step and the second etch step are dry etching processes and the third etch step is a wet etching process.

14. The method of claim 13, wherein the third etch step exposes the air gap.

15. The method of claim 10, further comprising:
forming a contact adhesion layer over the first oxide layer before forming the ruthenium layer, wherein the ruthenium layer is formed over the contact adhesion layer; and
patterning the contact adhesion layer.

16. A method comprising:
forming a device-level contact in a first dielectric layer;
depositing a ruthenium layer over the device-level contact and the first dielectric layer;
depositing a multilayer hard mask over the ruthenium layer;
using a top portion of the multilayer hard mask to form an oxide feature, wherein the oxide feature is disposed over the device-level contact and the top portion of the multilayer hard mask is removed when forming the oxide feature;
patterning a bottom portion of the multilayer hard mask and the ruthenium layer to form a contact structure over the device-level contact, wherein the oxide feature is used to pattern the bottom portion of the multilayer hard mask, the oxide feature is removed when patterning the bottom portion of the multilayer hard mask and the ruthenium layer, and the contact structure includes a ruthenium contact layer, a first mask layer over the ruthenium contact layer, and a second mask layer over the first mask layer;
depositing an amorphous material layer that wraps the contact structure;
depositing a second dielectric layer over the amorphous material layer, the first dielectric layer, and the contact structure;
planarizing the second dielectric layer, wherein the planarizing removes the second mask layer of the contact structure and exposes the first mask layer of the contact structure;
after removing the first mask layer of the contact structure, removing the amorphous material layer from along sidewalls of the contact structure;
depositing an etch stop layer over the second dielectric layer and the ruthenium contact layer of the contact structure, wherein the etch stop layer partially fills a recess formed by the removing of the first mask layer of the contact structure;
forming a third dielectric layer over the etch stop layer; and
forming a metal contact that extends through the third dielectric layer, the etch stop layer, and the second dielectric layer to the ruthenium contact layer.

17. The method of claim 16, wherein the removing the amorphous material layer from along sidewalls of the contact structure forms a void between the ruthenium contact layer and the second dielectric layer along a first direction, and along a second direction, the void is further between the metal contact and the first dielectric layer.

18. The method of claim 17, wherein, along the second direction, the void is further between the amorphous material layer and the ruthenium contact layer.

19. The method of claim 16, wherein the depositing the amorphous material layer includes depositing an amorphous silicon layer.

20. The method of claim 16, wherein the first mask layer is a dielectric layer and the second mask layer is a metal layer.

* * * * *